(12) United States Patent
Takeuchi et al.

(10) Patent No.: US 6,784,041 B2
(45) Date of Patent: Aug. 31, 2004

(54) SEMICONDUCTOR DEVICE AND METHOD OF MANUFACTURING THE SAME

(75) Inventors: Yuji Takeuchi, Yokohama (JP); Masayuki Ichige, Yokohama (JP); Akira Goda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/727,647

(22) Filed: Dec. 5, 2003

(65) Prior Publication Data

US 2004/0084715 A1 May 6, 2004

Related U.S. Application Data

(62) Division of application No. 10/098,130, filed on Mar. 15, 2002, now Pat. No. 6,720,612.

(30) Foreign Application Priority Data

Mar. 16, 2001 (JP) ........................................ 2001-075511

(51) Int. Cl.$^7$ ......................................... H01L 21/8238
(52) U.S. Cl. ..................... 438/201; 438/211; 438/257; 438/264; 438/591; 438/593; 257/239; 257/261; 257/298; 257/315

(58) Field of Search .................................. 438/201, 211, 438/216, 241, 257, 258, 260–266, 591, 593; 257/239, 261, 298, 315–326

(56) References Cited

U.S. PATENT DOCUMENTS

| | | | |
|---|---|---|---|
| 5,323,048 A | | 6/1994 | Onuma |
| 5,698,879 A | | 12/1997 | Aritome et al. |
| 6,160,297 A | | 12/2000 | Shimizu et al. |
| 6,232,176 B1 | * | 5/2001 | Parekh et al. ............... 438/255 |
| 6,255,155 B1 | | 7/2001 | Lee et al. |
| 6,310,374 B1 | | 10/2001 | Satoh et al. |
| 6,384,449 B2 | | 5/2002 | Lee et al. |
| 6,429,147 B2 | | 8/2002 | Hara |

* cited by examiner

Primary Examiner—David Nelms
Assistant Examiner—Andy Huynh
(74) Attorney, Agent, or Firm—Oblon, Spivak, McClelland, Maier & Neustadt, P.C.

(57) ABSTRACT

A NAND type semiconductor device is disclosed, in which a first insulating film embedded between the memory cell gates and between the memory cell gates and the selecting gate does not contain nitrogen as a major component, a second insulating film is formed on the first insulating film, and an interlayer insulating film is formed on the second insulating film whose major component is different from a manor component of the second insulating film.

28 Claims, 34 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2001-075511, filed Mar. 16, 2001, the entire contents of which are incorporated herein by reference.

BACKGROUND OF THE INVENTION

1. Field of the Invention

The present invention relates to a semiconductor device having an element isolation region and a transistor, and a method of manufacturing the semiconductor device, and particularly relates to a semiconductor device in which a contact is formed in the vicinity of the element isolation region and the transistor and the method of manufacturing the semiconductor device.

2. Description of the Related Art

Conventionally, as for a semiconductor memory, an EEPROM (Electrically Erasable Programmable Read-Only Memory) in which data is electrically written/erased is known. In the EEPROM, a memory cell is arranged respectively at the intersection where a row line and a column line are crossed each other to form a memory array. Generally, a MOS transistor having a laminated gate structure in which a floating gate and a control gate are laminated is employed for a memory cell.

As a method suitable for a memory having a large capacity among EEPROMs, a NAND type EEPROM as shown in FIG. 33 is known. Here, FIG. 31 is a view showing a cross section taken along the line XXXI—XXXI in FIG. 33, and FIG. 32 is a view showing a cross section taken along the line XXXII—XXXII in FIG. 33.

As shown in FIGS. 31 and 32, a plurality of memory cell transistors are connected in series in a memory cell array of a NAND type EEPROM, and a drain side selecting gate transistor 53 is connected to its one side, and a source side selecting gate transistor 54 is connected to the other side. A well 51 is formed on part of a semiconductor substrate 50, and a plurality of element regions 55 in a stripe shape are formed therein. Each element region 55 is Isolated by an element isolation region 56. On each element region 55, a plurality of cell transistors having a laminated gate structure are formed in a line along the extension direction of the stripe, and a plurality of cell transistors are arranged in a matrix shape on the entire surface of the plural element regions 55.

As shown in FIG. 31, each memory cell has a gate electrode portion 52 formed on a gate insulating film 57 located on the element region 55, and the gate electrode section 52 is configured by laminating a floating gate electrode 58 which becomes an electric charge accumulation layer, an inter-gate insulating film 59, a control gate electrode 60 and a gate protection film 71. Furthermore, the control gate electrode 60 becomes, as shown in FIG. 33, a word line 61 by being shared with the other gate electrodes in the row direction.

In each element region, a source and a drain of each memory cell are connected with each other via a source/drain diffusion layer region 62. In each element region, a source and a drain of each memory cell are a common region with a drain and a source of the adjacent memory cell, thereby connecting a plurality of memory cells in series to form one NAND cell memory cell unit) in each element region.

The drain side selecting gate transistor 53 and the source side selecting gate transistor 54 are connected, respectively, to one end and the other end in the direction of a bit line of each NAND cell (i.e., extension direction of stripe). The respective selecting gate transistors 53 and 54 have a gate electrode formed on the gate insulating film 57, and connected to the NAND cell via the diffusion layer region 62. Moreover, the selecting gate transistors 53 and 54 are configured so as to be capable of applying a potential to the floating gate electrode. The selecting gate transistors 53 functions in the same manner as a general MOSFET, and its laminated layer gate structure is similar to that of the memory cell transistor.

Moreover, a bit line contact diffusion layer 62 is formed on the side of the drain side selecting gate transistor 53 opposing to the NAND cell within the element region 55. A bit line contact 63 is connected to this bit line contact diffusion layer 62. This bit contact 63 is connected to a bit line 64.

A post-oxidation film 65 is formed on the surfaces of the respective gates 52, 53 and 54. Then, a silicon nitride film 67 is formed On the surface of the post-oxidation film 65, the source/drain diffusion layer 62, the drain contact diffusion layer 62, and a source diffusion layer 66 of the source side selecting gate 54, that is, on the diffusion layer 66 opposite to the memory cell. An interlayer insulating film 68 is formed on the surface of the silicon nitride film 67 and further the surface thereof is flattened.

Here, the bit line contact 63 is formed in the gate insulating film 57, the silicon nitride film 67 and the interlayer insulating film 68. The bit line 64 is formed on the interlayer insulating film 68. The bit line 64 is independently formed in each NAND cell formed in parallel with each other in the direction of the column (i.e., extension direction of stripe).

Moreover, a source line (not shown) is connected to the source diffusion layer 66 formed on the side of the source side selecting gate transistor opposing to the NAND cell. The source line is formed on the upper layer above the gate electrode, the contact is connected to a layer portion (not shown) to which one end of the floating gate is extended. The source line is formed commonly in a NAND cell formed in parallel in the direction of the column.

As shown in the cross sectional view shown in FIG, 32, the plural element isolation regions 56 define the plurality of element regions 55 in the well 51 on the semiconductor substrate 50. The bit line contact 63 is connected to the entire surface of the element regions 55 defined by the element isolation regions 56. The silicon nitride film 67 is formed on the element isolation region 56, and the interlayer insulating film 68 is formed thereon. The bit line contact is formed in the interlayer insulating film 68 and the silicon nitride film 67. The bit line wiring 64 is formed on the bit line contact 68.

Next, a method of manufacturing a conventional semiconductor device shown in FIG. 31 through FIG. 33 will be described below with reference to FIG. 34 through FIG, 36.

First, as shown in FIG. 34, the element region 55 surrounded by an element isolation region (not shown) is formed on the semiconductor substrate 50 made of silicon, the gate insulating film 57, the floating gate electrode film layer 58 and an inter-gate insulating film layer 59 are formed thereon, and the control gate electrode layer 60 and the gate protection film layer 70 are deposited thereon. Subsequently, the memory cell gate 52 and the selecting gates 53 and 54 are formed by patterning these layers using a lithography method and etching them.

Next, the post-oxidization is performed and the post-oxidization film 65 is formed around the gate electrode of the laminated structure.

Then, the source/drain diffusion layer 62, the drain contact diffusion layer 62 and the source diffusion layer 66 are formed by performing the ion implantation of an impurity.

After that, as shown in FIG. 35, for example, the silicon nitride film 67 on the order of 40 nm in thickness, for example, is deposited. At this time, the silicon nitride film 67 is formed so as to also cover the gate electrode sidewall.

Furthermore, the interlayer insulating film 68 is deposited until it is embedded between the gate electrodes, and subsequently, the interlayer insulating film 68 is flattened by performing the re-flowing using a CMP (Chemical Mechanical Polishing) and a thermal processing.

Next, as shown in FIG. 36, a contact hole 71 for contact with the bit line contact diffusion layer 62 adjacent to the drain side selecting gate 53 is formed in the interlayer insulating film 68, the silicon nitride film 61 and the gate oxide film 57.

Next, subsequently, a metal or a low resistive semiconductor is embedded in the contact hole 71, and then, a semiconductor device as shown in FIG. 31 is completed by forming metal wirings.

As described above, in a conventional semiconductor device, after the formation of the gate electrode, the silicon nitride film 67 covering the entire surface is formed. The reason why the silicon nitride film 67 is needed will be described below.

As shown in FIG. 32 and FIG. 33, the bit line contact 63 is designed so that there is no margin with respect to the element region 55. Specifically, the bit line contact 63 is formed with respect to the element region 55 so as to fit the rim of its width. Note that there are some cases where the bit line contact 63 is designed so as to be wider than the element region 55. This is for the sake of being capable of diminishing the area of the cell array as narrow as possible.

In the semiconductor device, it must be made so that the bit line contact does not penetrate within the element isolation region even when the formation position of the contact is intruded into the element isolation region by the reasons that the deviation of the positioning of a mask or the like occurs. This is because it causes the occurrence of the junction leak current in that portion or the lowering of the breakdown voltage of the element if the bit line contact penetrates the element isolation region.

In the case of a semiconductor device without a silicon nitride film, as shown in FIG. 21, it may be possible that the contact hole 71 penetrate the element isolation region 56 since the insulating film of the element isolation region 56 is also etched when the interlayer insulating film 68 is etched at the time of opening the contact hole 71 for bit line contact. In this case, the portion where the bit line contact 63 has intruded within the element isolation region 56 and formed is conducted to the element region 55, that is, an electric contact is made except for the contact on the source/drain diffusion layer 62, and the characteristics of the transistor are damaged.

These are the reasons why in general, upon the etching at the time when the contact hole 71 is opened, the etching is excessively performed to some extent that the contact hole 71 is securely opened even if the variations of the process exist, and in general, since the interlayer insulating film and the insulating film of the element isolation region are formed with a silicon oxide film, it is difficult to selectively etch only the interlayer insulating film. Such a state possibly occurs when the width of the element region and the width of the bit line contact are close to each other.

In order to prevent such a phenomenon, in a conventional semiconductor device, as described above, the silicon nitride film 67 is employed. Using this, in a miniaturized semiconductor device, the etching can be stopped on the silicon nitride film 67 once even if the deviation M of the positioning has occurred as shown in FIG. 38, by having made the etching at the time of opening the contact hole the selectivity of the silicon oxide film and the silicon nitride film.

Thus, after the contact hole reaching the portion above the silicon nitride film 67 is opened, the silicon nitride film 67 is etched by changing the conditions for etching, and the silicon oxide film on the substrate is etched by further changing the conditions, thereby the contact hole 71 located above the source/drain diffusion layer is completely opened.

In this way, it can be prevented that the element isolation region 56 is largely etched by opening the bit line contact hole 71 for contact with the diffusion layer. In this way, it is prevented that the contact hole 71 penetrates the element isolation region 56 by the silicon nitride film 67 functioned as an etching stopper.

In a conventional semiconductor device as described above, the following problems occur.

In a semiconductor memory device using the conventional silicon nitride film, a large amount of hydrogen is contained in the silicon nitride film. If this hydrogen is incorporated into the silicon oxide film, the structure defect such as Si—H bonding or the like is easily occurred on the interface with the silicon substrate. The bonding energy of this Si—H bonding is weak as compared to the bonding energy of Si—O bonding.

Here, in a non-volatile semiconductor memory device or the like, at the time of operating the memory writing/erasing, a strong electric field is applied between the control gate and the channel, tunnel current is flown to the gate insulating film, thereby executing the operation that the electric charge is implanted to or removed from the floating gate. In such an operation, if the tunnel current is flown near the gate insulating film, an electric stress is to be added.

If a film having a large amount of hydrogen content exists in the vicinity of the gate insulating film, the structure defect such as Si—H bonding or the like tends to be easily occurred on the interface with the silicon substrate because the hydrogen is incorporated into the silicon oxide film.

When this structural defect is cut down by an electric stress or the like, it acts as a trap for an electric charge. Particularly, when this trap occurs on a silicon oxide film which is a gate insulating film, or on the post-oxidization film in the vicinity of the gate insulating film, or the like, it will cause the deterioration of the electric characteristics such as the variation of threshold voltage of the transistor, the lowering of breakdown voltage of the silicon oxide film or the like.

Moreover, when the electric charge to the trap of the post-oxidization film covering the surface of the source/drain diffusion layer is captured, the diffusion layer near the surface of the substrate is depleted and as a result, a parasitic resistance of the source/drain is increased, the lowering of the on-current of the transistor may occur.

Moreover, it is known in general that also in the silicon nitride film, a large number of traps with respect to the electric charge exist. Particularly, when the electric charge is captured by the trap of the silicon nitride film covering the surface of the source/drain diffusion layer, the diffusion layer near the surface of the substrate is depleted, as the result, the parasitic resistance of the source/drain is increased, the lowering of the on-current of the transistor may occur.

Moreover, when the electric charge is captured in the silicon nitride film near the gate insulating film, it will cause the deterioration of the electric characteristics such as the variation of the threshold voltage of the transistor, the lowering of the silicon oxide film breakdown voltage.

These problems is particularly significant when the gate length is smaller than about 0.2 $\mu$m Specifically, it is significant when the ratio of the silicon oxide film, post-oxidization film and silicon nitride film in which traps occur near the gate insulating film occupying the entire gate is large.

As described above, the silicon nitride film is needed for etching the contact hole, while the adverse influence of the silicon nitride film is seen with respect to the electric characteristics. Therefore, it has been difficult to realize the enhancement of both of the yield and reliability of the semiconductor device.

BRIEF SUMMARY OF THE INVENTION

According to a first aspect of the present invention, there is provided a semiconductor device comprising a semiconductor substrate; a first gate electrode formed on the semiconductor substrate; a first diffusion layer formed in the semiconductor substrate, the first diffusion layer being provided under one of opposite side portions of the first gate electrode; a second diffusion layer formed in the semiconductor substrate, the second diffusion layer being under another one of the opposite side portions of the first gate electrode; a second gate electrode formed on the semiconductor substrate, a side portion of the second gate electrode being provided on the second diffusion layer; a first insulating film formed on the semiconductor substrate, the first insulating film covering the first gate electrode, the second gate electrode, the first diffusion layer and the second diffusion layer, a portion of the first insulating film being embedded between the first gate electrode and the second gate electrode, a thickness of a portion of the first insulating film, which is provided on the first diffusion layer, being thinner than a thickness of the portion of the first insulating film, which is embedded between the first gate electrode and the second gate electrode, the first insulating film not containing nitrogen as a major component; a second insulating film formed on the first insulating film; an interlayer insulating film formed on the second insulating film, a major component of the interlayer insulating film being different from a major component of the second insulating film; and a contact electrode connected to the first diffusion layer, the contact electrode being formed in the first insulating film, the second insulating film and the interlayer insulating film.

DETAILED DESCRIPTION OF THE INVENTION

Figure 1:
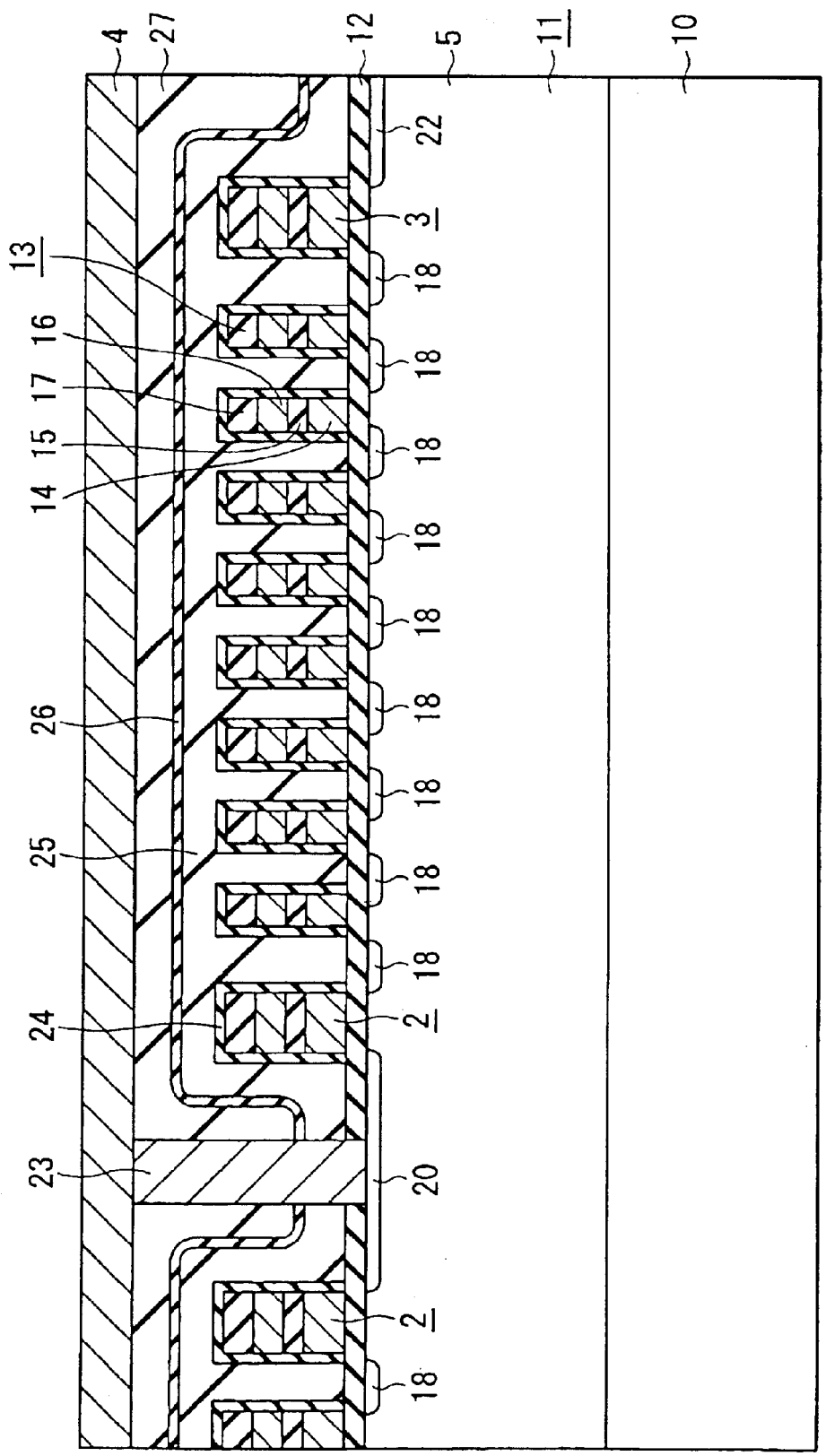
FIG. 1 is a cross sectional view taken along the line I—I in a plan view of FIG. 3 showing a semiconductor device according to a first embodiment of the present invention.

Next, the embodiments of the present invention will be described below with reference to the drawings In the description of the following drawings, the same or similar reference numerals and letters are attached to the same or similar portions. However, the drawings are schematic ones, the relation between the thickness and the plane dimension, the ratio of the thickness of each layer, and the like are different from the actual ones. Therefore, as for the concrete thickness and the dimension should be determined by considering the following description. Moreover, the different portions in the relation of sizes and ratios between the drawings are included.

(First Embodiment)

Figure 2:
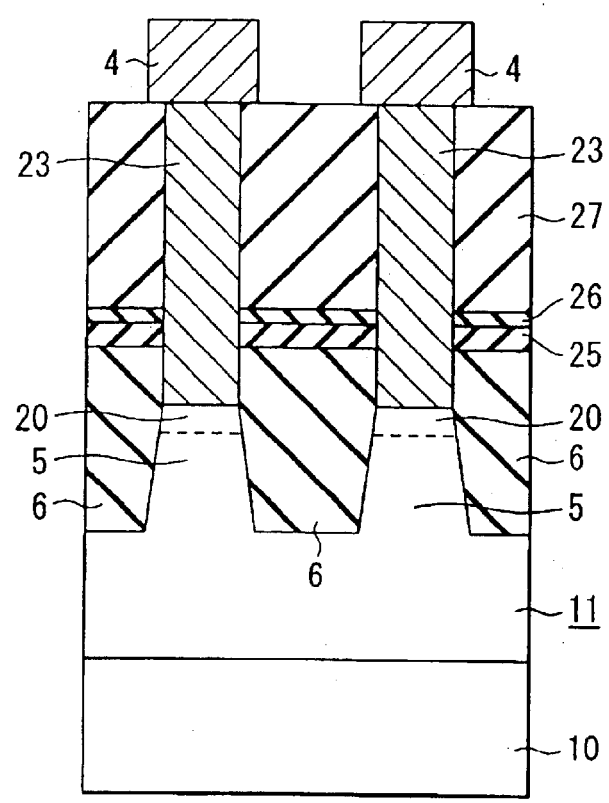
FIG. 2 is a cross sectional view taken along the line II—II in the plan view of FIG. 3 showing the semiconductor device according to the first embodiment of the present invention.
Figure 3:
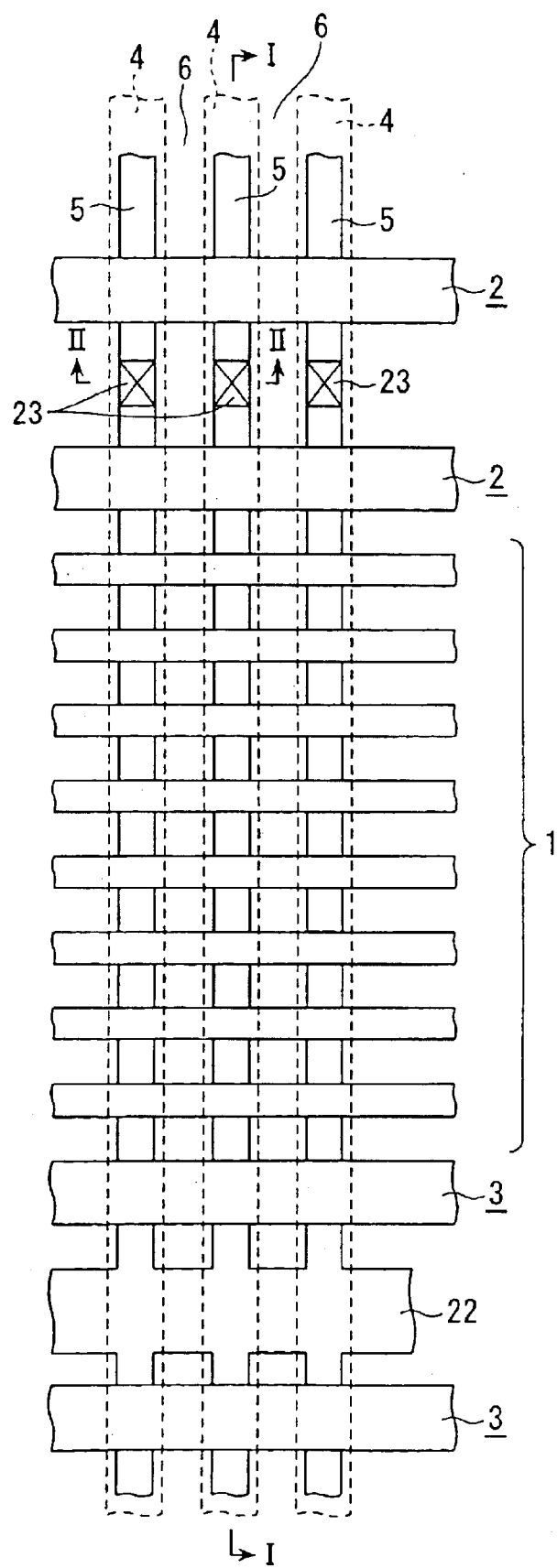
FIG. 3 is the plan view showing the semiconductor device according to the first embodiment of the present invention.
Figure 4:
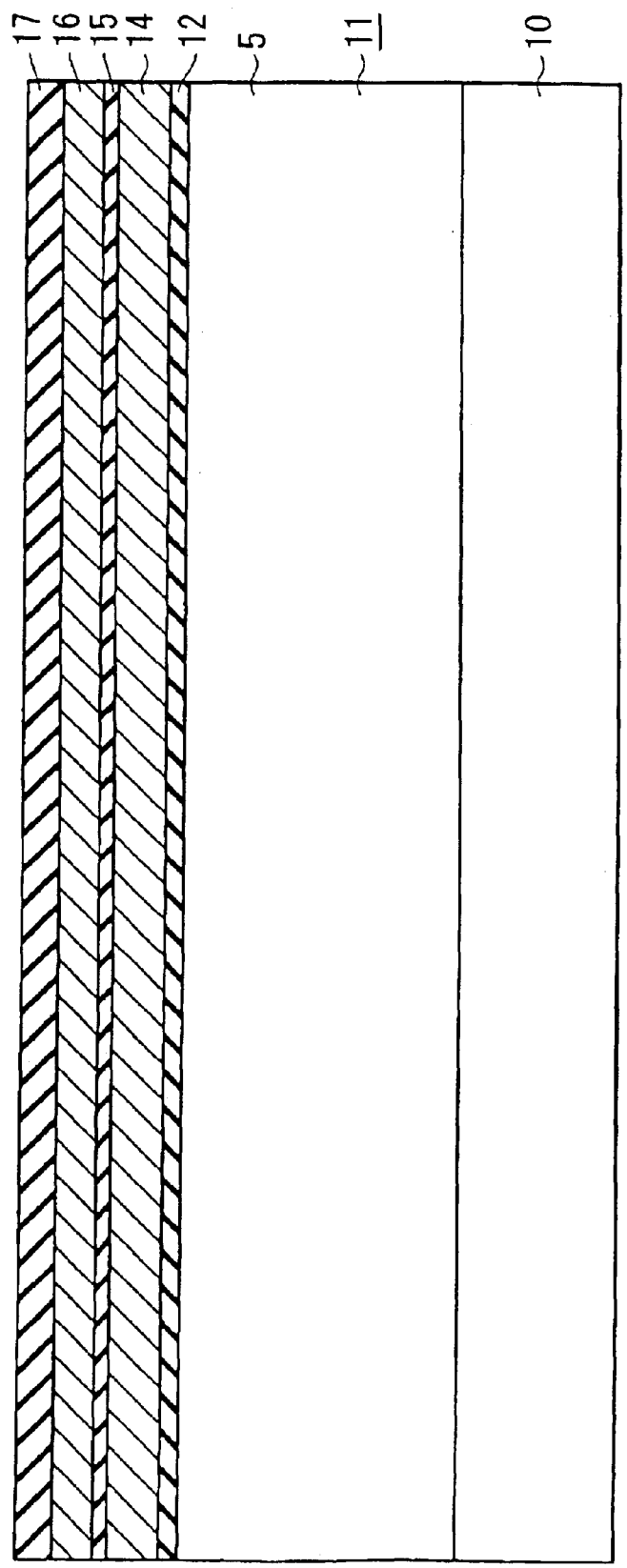
FIG. 4 is a cross sectional view showing one step of a method of manufacturing the semiconductor device according to the first embodiment of the present invention.

The present embodiment will be described below with reference to FIG. 1 through FIG. 9. The present embodiment is applied to a NAND flash memory, and it will be described below. A plan view of a NAND flash memory according to the present embodiment is shown in FIG. 3. A cross section taken along the line I—I in FIG. 3 is shown in FIG. 1, and a cross section taken along the line II—II in FIG. 3 is shown in FIG. 2.

As shown In FIG. 3, 8 word lines 1 are arranged in parallel with each other and extend in the row direction. A drain side selecting gate 2 and a source side selecting gate 3 are formed in parallel with each other so as to sandwich the word-lines 1 therebetween.

A plurality of bit line wirings 4 are formed perpendicularly to the word lines 1, the drain side selecting gate 2 and the source side selecting gate 3.

Element region 5 are formed under the bit line wirings 4, respectively.

Element isolation regions 6 isolating the element regions 5 from each other are formed in parallel with the element regions 5.

One bit line wiring 5, the 8 word lines 1, the drain side selecting gate 2, the source side selecting gate 3 and diffusion layers 18 between these selecting gates 2 and 3 make up one memory cell array.

Here, a bit line contact 23 is formed in the element region adjacent to the drain side selecting gate.

One memory cell array is adjacent to another memory cell array in the direction of the bit line wiring 5 at the side of the selecting gate 2 via a bit line contact 23. Furthermore, the memory cell array is adjacent to a further memory array in the direction of the bit line wiring 5 at the side of the selecting gate 3 via a source line 22.

In a cross sectional view shown in FIG. 1, 8 memory cells in one memory cell array each have a memory cell gate 13 formed on a gate insulating film 12 on the element region 5 in the well 11 are formed on the semiconductor substrate 10. Each memory cell gate electrode 13 has a floating gate electrode 14 which becomes a charge accumulation layer, an inter-gate insulating film 15 formed on the floating gate electrode 14, a control gate electrode 16 formed on the inter-gate insulating film 15, and a gate mask film 17 formed on the control gate electrode 16. The control gate electrode 16 of one memory cell gate 13 in a row is common to the control gate electrode of another memory cell gate 13 in the row and forms the word line 1.

The memory cells are connected in series with each other via the source/drain diffusion layer regions 18 formed in the element region 5. A NAND cell (memory cell unit), which is one memory cell array, is formed of the series-connected memory cells.

Furthermore, a drain side selecting gate 2 is formed on the gate insulating film 12 on the left end of 8 memory cells. Although the drain side selecting gate 2 has a laminated layer structure similar to that of the memory cell gate 13, the width of the layers is larger than that of a memory cell gate. A bit line contact diffusion layer 20 is formed in the element region 5 on the side of the drain side selecting gate opposing to the memory cells.

Furthermore, a source side selecting gate 3 is formed on the gate insulating film 12 on the right end of 8 memory cells. Although the source side selecting gate 3 has a laminated layer structure similar to that of the memory cell gate 13, the width of the layers is larger than that of the memory cell gate, and the width is the same as that of the drain side selecting gate.

In FIG. 1, a source line 22 is provided at a side of the source side selecting gate 3, which is opposite to the memory cell gate side thereof, and the source line 22 is extended orthogonally to the direction of the surface of the drawing. The source line 22 is connected to NAND cells adjacent to each other in the row direction.

A memory cell transistor comprises each memory cell gate 13 and the diffusion layers 18 adjacent to the memory cell gate 13.

Furthermore, a drain side selecting transistor comprises the drain side selecting gate 2, the diffusion layer 18 adjacent to the drain side selecting gate 2 at the memory cell side, and the bit line contact diffusion layer 20.

Furthermore, a source side selecting transistor comprises the source side selecting gate 3, the diffusion layer 18 adjacent to the source side selecting gate 3 at the memory cell side, and the source line 22.

The memory cell transistors are connected to each other in series. The drain side selecting transistor and the source side selecting transistors are connected to the NAND cells via the diffusion layers 18. In this way, the drain side selecting transistor and the source side selecting transistor are connected on the respective ends of the NAND cells in the bit line direction.

Moreover, these selecting transistors are capable of applying a potential to the floating gate electrodes of these selecting gates, and function similarly to ordinary MOSFETs.

Moreover, the bit line contact electrode 23 is formed on the bit line contact diffusion layer 20 on the side of the drain side selecting transistor opposing to the NAND cells.

Here, the surface of each of the gates 13, 2 and 3 is covered with a post-oxidization film 24. A first insulating film 25 is formed on the post-oxidization film 24 and the gate oxide film 12. The thickness of the first insulating film 25 is, for example, about 0.1 μm or more, and the film does not contain nitrogen as the major component. The first insulating film 25 is formed so as to embed between the gate electrodes 13 of the memory cell transistors. A film containing a small amount of hydrogen and having fewer traps with respect to electric charges is suitable as the first insulating film 25. For example, a silicon oxide film, an oxynitride film, an oxidized silicon nitride film can be used.

A thickness of a portion of the first insulating film 25, which is formed on the side portion of the selecting gate 2, is larger than half a distance between the memory cell gates. The side portion of the selecting gate 2 is opposite to another side portion of the selecting gate 2, which is adjacent to the memory cell gates. Similarly, a thickness of a portion of the first insulating film 25, which is formed on the side portion of the selecting gate 3, is larger than half a distance between the memory cell gates. The side portion of the selecting gate 3 is opposite to another side portion of the selecting gate 3 which is adjacent to the memory cell gates.

Now, the phrase "to embed" means not only to completely embed, but also to embed but include a cavity or cavities, since the functions and effects are not changed even if it includes a cavity such as void inside thereof.

Here, the distance between the gate electrodes is, for example, about 0.2 μm, the width of the gate is about 0.2 μm, and the height is about 0.6 μm.

The distance between the memory cell gates 13 is small, on the other hand, the distance between the selecting gates 2 sandwiching the bit line contact 23 is large. Since the distance between the memory cell gates 13 greatly influences the area of the entire cell array, the distance is made small for reducing the area of the cell array. On the other hand, the distance between the selecting gates 2 of the memory cell arrays adjacent each other is made large, since the bit line contact 23 is formed between the selecting gates 2.

A second insulating film 26 is formed on the first insulating film 25. The thickness of the second insulating film 26 is, for example, in the range of about 0.02 to 0.06 μm. Since the second insulating film 26 comprises mainly a nitride film and nitride functions as a hydrogen supplying source, then the second insulating film 26 is desirable to be as thin as possible. The second insulating film 26 contains a larger amount of hydrogen than the first insulating film 25 and has a number of traps with respect to the electric charges.

An interlayer insulating film 27 is formed on the second insulating film 26. Here, the thickness of the interlayer insulating film 27 is about 0.1 μm to 0.3 μm. The interlayer insulating film 27 can be formed of BPSG (Boron Phosphorus Silicate Glass).

The bit line contact 23 is formed in the interlayer insulating film 27, the second insulating film 26, the first insulating film 25 and the gate oxide film 12, and connected to the bit line contact diffusion layer 20.

A bit line 4 is formed on the Interlayer insulating film 27. The bit lines ar formed in a form of being separated between the adjacent NAND cells in the row direction.

The NAND cell is formed in a form that eight memory cell transistors are sandwiched between the two selecting gates, however, the number of the memory cell transistors are not limited to eight, and may be 32, for example.

Moreover, when the distance between the memory cell gates is about 0.2 μm or less, the effects of the present embodiment are significant.

Here, the well is P-type, and the source/drain diffusion layer is N-type, however, the well may be N-type, and the source/drain diffusion layer may be P-type.

In the present embodiment, since the first insulating film 25 is formed under the second insulating film 26 which functions an etching stopper at the time when the contact hole is formed, then the distance between the memory cell gates 13 is comparatively small. Thus, the portion between the memory cell gates 13 is completely embedded with the first insulating film 25. Moreover, since the distance between the selecting gates 2 is larger than that between the memory cell gates 13, then it is not completely embedded with first insulating film 25.

The first insulating film 25 is formed in the same thickness on the gate electrodes 13, 2 and 3 and on the bit line contact diffusion layer 20. However, in some cases, the thickness formed on the side surfaces of the gate electrodes 13, 2 and 3 is formed thinner or on the contrary, thicker than that of the first insulating film 25 formed on the upper surfaces of the gate electrode 13, 2 and 3 and on the semiconductor substrate.

Next, in a cross sectional view shown in FIG. 2, the element isolation regions 6 are formed so as to divide the upper surface of the element region 5 formed in the well 11 on the semiconductor substrate 10. The bit line contact 23 is formed to the entire element region 5 sandwiched between the element isolation regions 6. The first insulating film 25 is formed on the element isolation region 6, and the second insulating film 26 is formed on the first insulating film 25. The interlayer insulating film 27 is formed on the second insulating file 26. The bit line contact 23 is formed in the interlayer insulating film 27, the second insulating film 26 and the second insulating film 25. The bit line wiring 4 is formed on the bit line contact 23.

Here, although the upper surface of the element isolation region 6 is formed at the position higher than the upper surface of the element region 5, it may be formed at the position having the same height as the upper surface of the element region 5.

As for a method of isolating an element, although STI (Shallow Trench Isolation) is employed, other methods of isolating semiconductor elements, such as LOCOS (Local Oxidation of Silicon) or the like, can be used.

In FIG. 2, it is desirable that the thickness of the first insulating film 25 on the element isolation region 6 is formed to be as thin as possible because the effect of an etching stopper is large in the case where the misalignment of positioning of the contact occurs.

In the semiconductor device of the present embodiment, the first insulating film 25 is formed under the second insulating film 26, thereby the influence of hydrogen in the second insulating film 26 and the electric charge trapped in the second insulating film 26 on the electric characteristics of the transistor element can be reduced. Furthermore, there can be formed a semiconductor device having a high integration density in which there is no mis-contact to the element isolation region even if the distance between the memory cell gates is made small.

Specifically, according to the semiconductor device of the present embodiment, since the deterioration of the electric characteristics such as the variation of threshold voltage of a transistor and the lowering of the breakdown voltage of the gate insulating film can be prevented while the process margin of the etching for forming the contact holes is enhanced, a semiconductor device with a high reliability and a high yield and a method of manufacturing the semiconductor device can be provided.

Particularly in the memory cell transistor portion, the portion between the gate electrodes is embedded with the first insulating film 25 so that the second insulating film 26 does not exist near the gate oxide film 12 of the memory cell transistor.

Therefore, the deterioration of the characteristics of the memory cell transistor can be prevented, and the enhancement of the reliability for the semiconductor device is obtained.

Particularly in a non-volatile semiconductor device, the distance between the selecting gates of the memory cell arrays adjacent each other is larger than the distance between the word lines of each of the memory cell arrays, and the entire memory cell array is covered with a laminated layer film composed of an oxide film and a nitride film. Here, the portion between the word lines is embedded with only the first insulating film 25, and both the first insulating film 25 and the second inflating film 26 are embedded in the portion between the selecting gates.

Here, since no nitride film containing a large amount of hydrogen exists in the portion between the word lines, the variation of the cell characteristics caused by trapping electrons in the nitride film can be prevented. Furthermore, a high reliability and a high yield are obtained since the nitride film in the second insulating film 26 located on the first insulating film 25 functions as a stopper at the time when the etching is performed upon the formation of the contact electrode between the selecting gates.

Next, a method of manufacturing the semiconductor device of the present embodiment will be described below with reference to FIG. 1 and FIG. 4 to FIG. 9.

First, as shown in FIG. 1, the element region 5 surrounded by the element isolation region (not shown) is formed on the semiconductor substrate 10 made of silicon, and then the gate insulating film 12 is formed on the element region 5. Next, the floating gate electrode material 14 is deposited on the gate insulating film 12. Furthermore, the inter-gate insulating film 15 is formed, and then the control gate electrode material 16 is deposited on the inter-gate insulating film 15.

Furthermore, the gate mask film 17 which functions an etching mask when the gate etching is performed is deposited. Subsequently, the gate is patterned by a photolithography, and the gate mask material 17 is etched. Subsequently, the control gate electrode material 16, the inter-gate insulating film 15 and the floating gate electrode material 14 are etched with respect to the gate mask film 17 in a self-aligned manner, whereby the memory cell gate 13 and the selecting gates 2 and 3 are formed.

Figure 5:
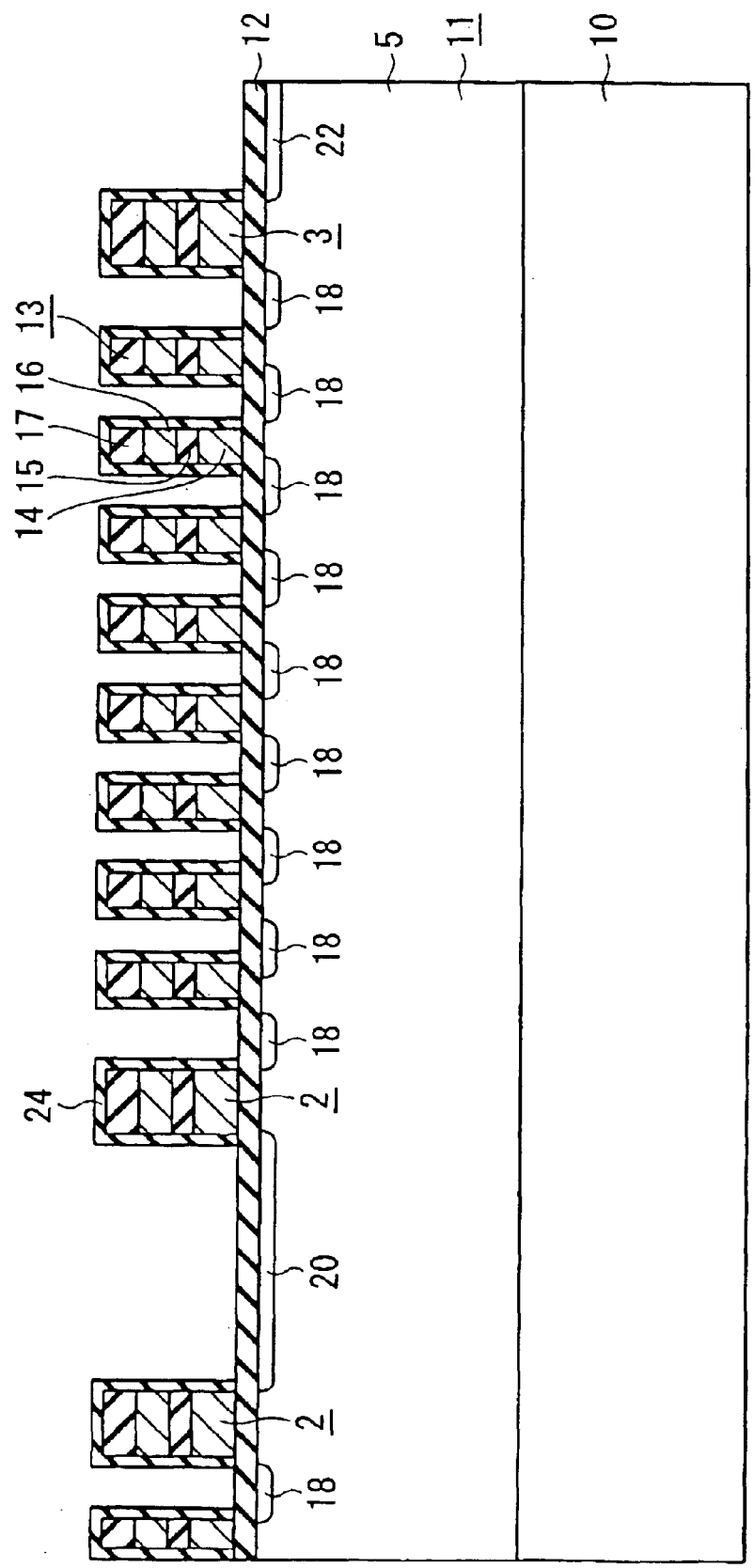
FIG. 5 is a cross sectional view showing one step of the method of manufacturing the semiconductor device according to the first embodiment of the present invention.

Next, as shown in FIG. 5, the post-oxidization for recovering the damage at the time of the gate processing is performed to form the post-oxidization film 24 around the gate electrode having the laminated layer structure.

Figure 6:
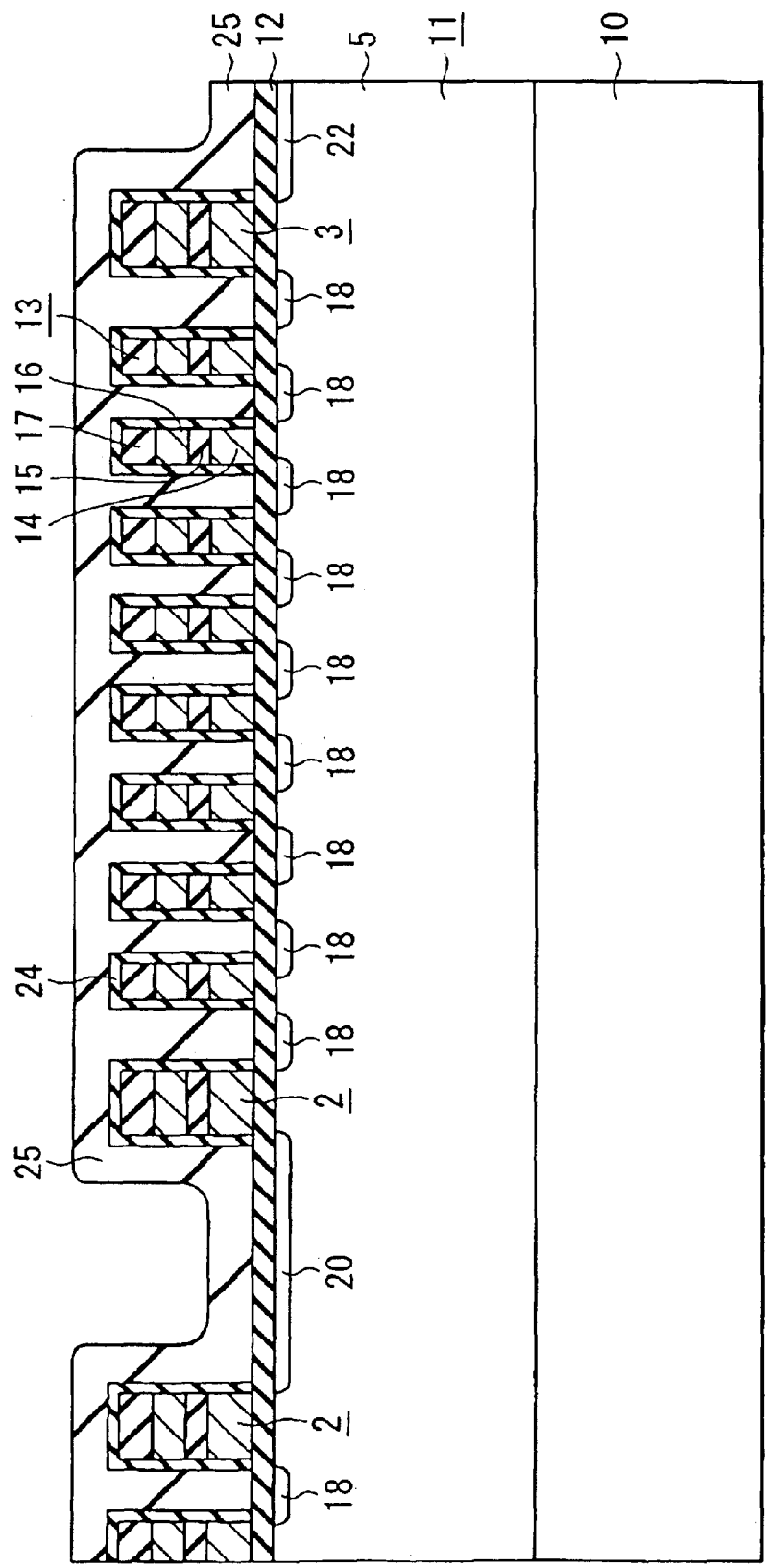
FIG. 6 is a cross sectional view showing one step of the method of manufacturing the semiconductor device according to the first embodiment of the present invention.

Next, as shown in FIG. 6, in order to form the source/drain diffusion layer 18 and the bit line contact diffusion layer 20, an impurity implantation is performed. This impurity implantation may be performed following the post-oxidization or before the post-oxidization. Furthermore, it may be also performed after the formation of the first insulating film executed in the later step.

Next, as shown in FIG. 6, the first insulating film 25 is formed on the exposed portion. The first insulating film 25 is so formed as to completely embed between the memory cell gates 13 of the memory cell transistors, not to completely embed between the selecting gates 2, and not to completely embed between the selecting gates 3. The first insulating film 25 is flattened over the upper surfaces of the eight memory cell gates 13, the upper surface of the drain side selecting gate 2 adjacent to the memory cell gates 13 and the upper surface the source side selecting gate 3 adjacent to the memory cell gates 13 and the spaces therebetween. Furthermore, the surface of the first insulating film 25 located on the area to be formed with the bit line contact is also flattened. Even if there is a cavity in the first insulating film 25, the cavity can be removed using a fluidization by oxidizing due to heating in the later step.

Figure 7:
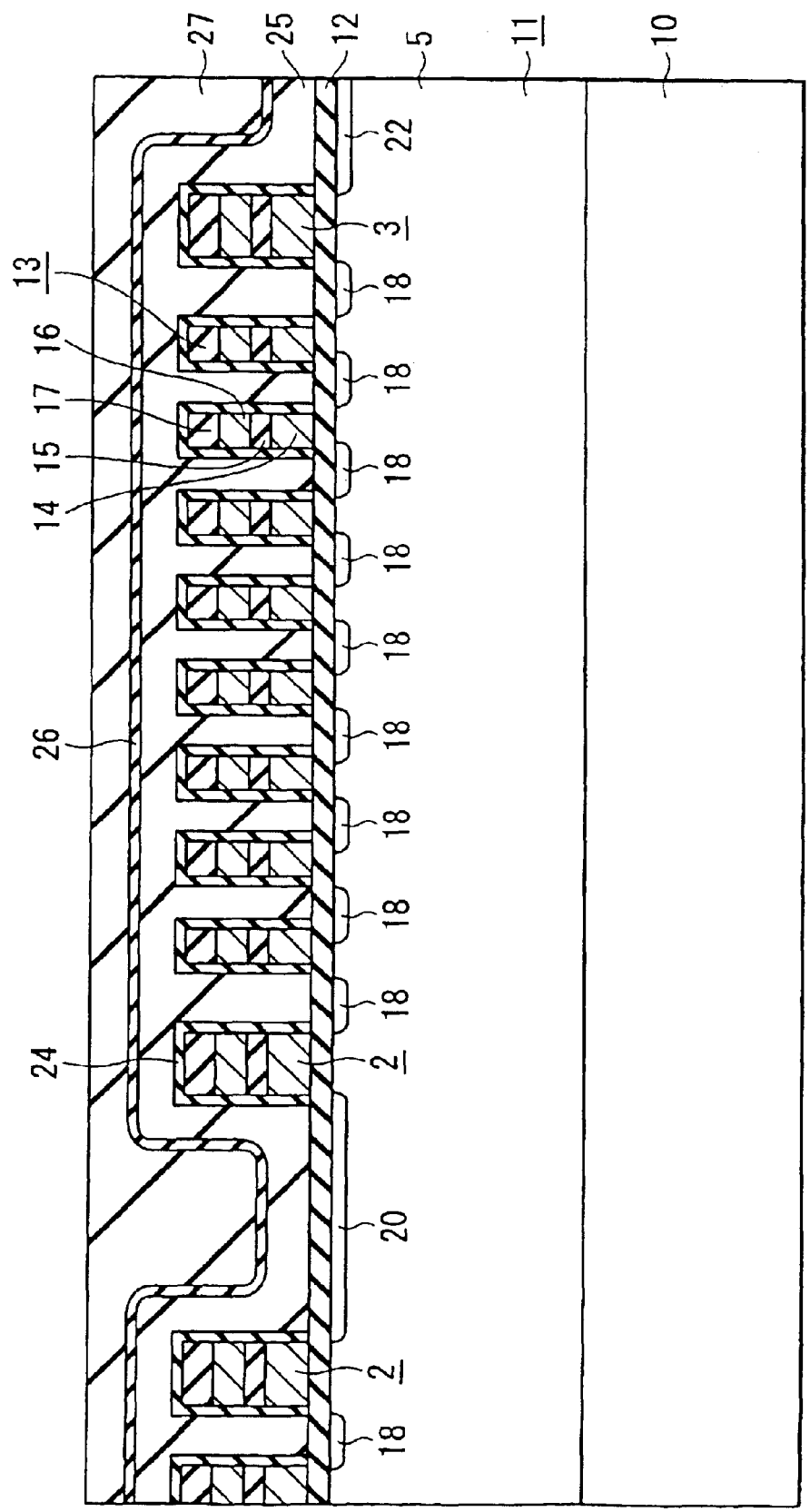
FIG. 7 is a cross sectional view showing one step of the method of manufacturing the semiconductor device according to the first embodiment of the present invention.

Next, as shown in FIG. 7, the second insulating film 26 is formed on the first insulating film 25. Furthermore, by depositing the interlayer insulating film 27 on the second insulating film 26 and by fluidizing the interlayer insulating film using a CMP method and by adding the heat treatment, the surface of the interlayer insulating film 27 is flattened and the portion between the selecting gates 2 and the portion between the selecting gates 3 are embedded with the interlayer insulating 27.

Here, there may be a case that when the portion between the selecting gates 2 and the portion between the selecting gates 3 are embedded with the interlayer insulating 27, these portions can not be completely embedded only by depositing the interlayer insulating film 27. In this case, after the interlayer insulating film 27 is deposited, a heat treatment is added to fluidize the interlayer insulating film material so that the interlayer insulating film 27 can be embedded in the portions. In some cases, the fluidization of the interlayer insulating film may be enhanced by performing this heating process in the oxygen atmosphere.

Even if there are some cavities in the interlayer insulating film 27, the cavities can be also removed using a fluidization by adding the heat in the later step. As for an impurity diffusion layer which becomes a source/drain, its diffusion coefficient is increased by performing the heating step.

Figure 8:
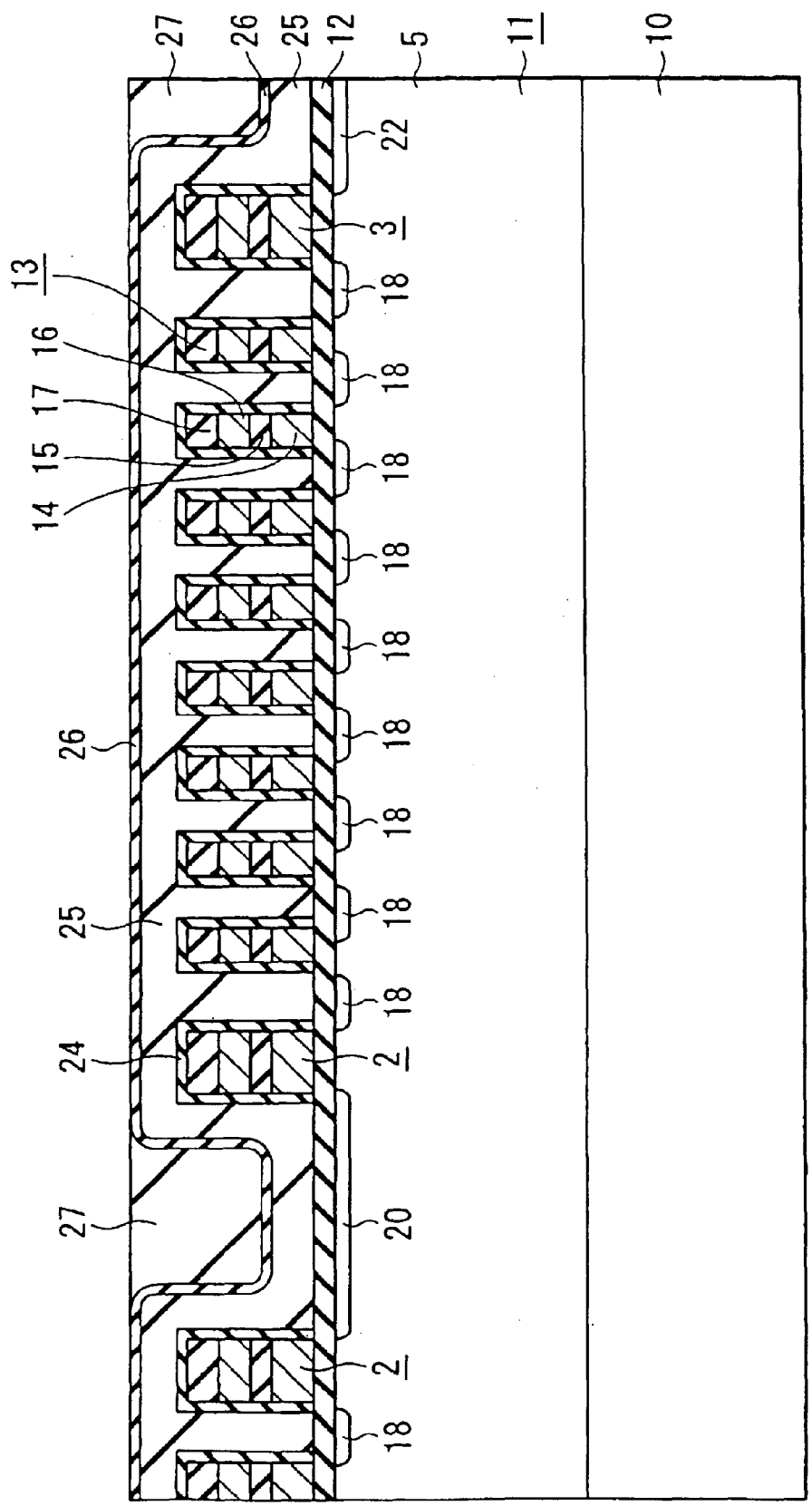
FIG. 8 is a cross sectional view showing one step of the method of manufacturing the semiconductor device according to the first embodiment of the present invention.

As shown in FIG. 8, the flattening can be performed by polishing the interlayer insulating film 27 using a CMP having the selectivity with respect to the second insulating film 26. The polishing is stopped on the second insulating film 26, and subsequently the interlayer insulating film is deposited again. In this way, the interlayer insulating film in the same shape as that shown In FIG. 7 can be formed. Here, the interlayer insulating film to be deposited again may be identical with the material previously deposited or may be different. According to this method, since the flattening using a CMP method is stopped on the second insulating film 26, the controllability of the film thickness of the interlayer insulating film can be enhanced, thereby the thickness of the interlayer insulating film can be precisely formed.

Figure 9:
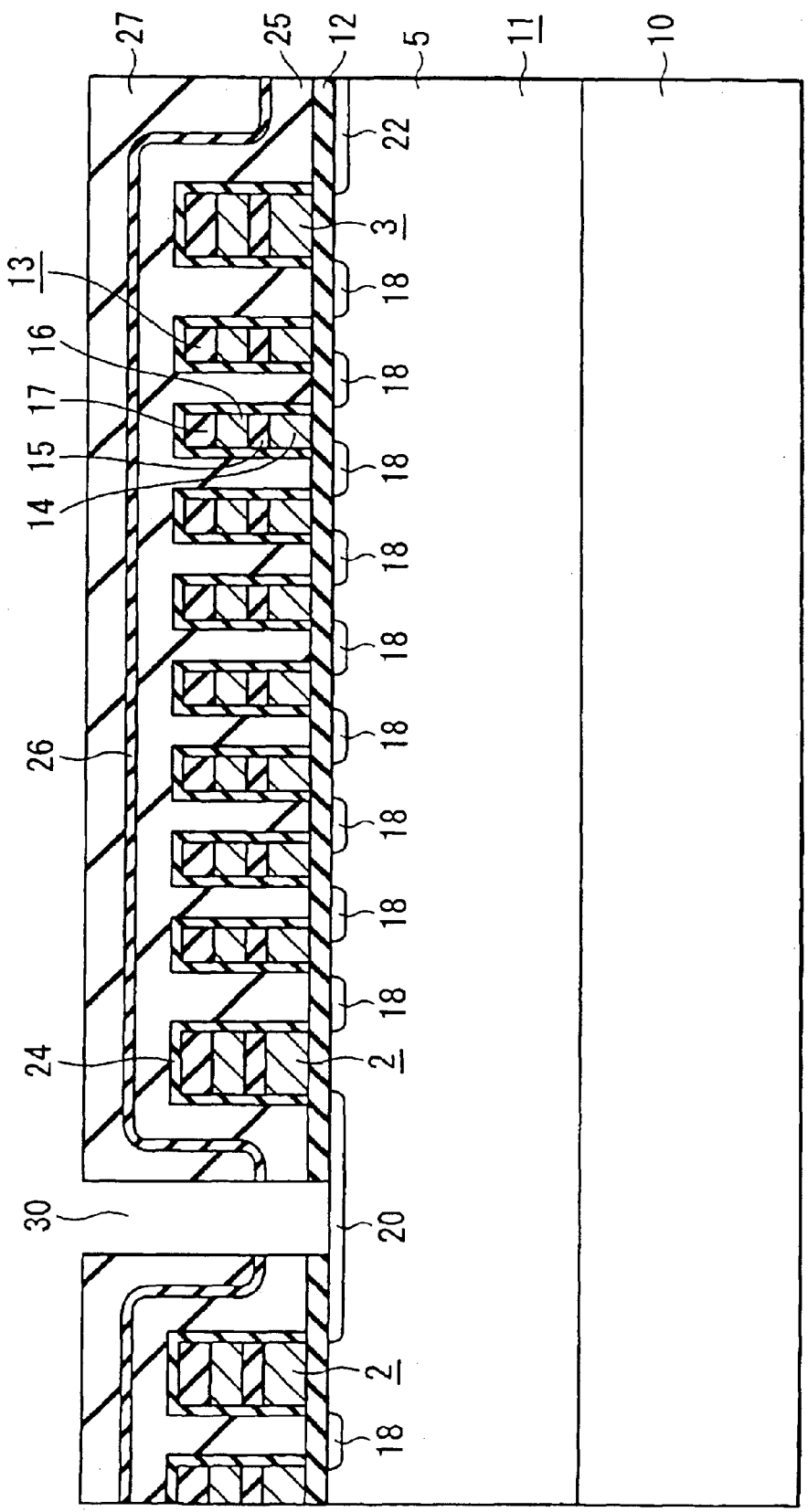
FIG. 9 is a cross sectional view showing one step of the method of manufacturing the semiconductor device according to the first embodiment of the present invention.

After the interlayer insulating film 27 is flattened as described above, a contact hole 30 for contact with the source/drain diffusion layer 20 of the memory cell portion is formed as shown in FIG. 9. The etching of the contact hole 30 is performed as follows. First, the interlayer insulating film 27 having the selectivity with respect to the second insulating film 26 is subjected to etching. Next, the second insulating film 26, the first insulating film 25 and the gate oxide film 12 are etched in turn to expose the bit line contact diffusion layer 20.

Next, as shown in FIG. 1, a metal such as aluminum, tungsten or the like or a semiconductor having a low resistance is embedded in the contact hole 30 to form the bit line contact 23. After the is 15 formation of the bit line contact 23, a metal wiring is formed on the interlayer insulating film 27, thereby the bit line wiring 4 for connecting to the bit line contact 23 is formed.

The cavity may be generated in the interlayer insulating film 27 and the first insulating film 25 between the memory cell gates 13.

Here, as the second insulating film 26, a film having an etching resistance against etching of the interlayer insulating film 27 at the time of forming the contact hole 30 is employed. For example, when a silicon oxide film is used as the interlayer insulating film 27, a silicon nitride film is used as the second insulating film 26.

In the present embodiment, as shown in FIG. 2 and FIG. 3, it is designed so that the bit line contact 23 has nearly no margin with respect to the element region 5.

Specifically, as shown in FIG. 3, the width of the bit line contact 23 is formed as same as that of the element region 5. In some cases, the width of the bit line contact 23 may be formed larger than that of the element region 5. This is because that the area of a cell array is reduced as small as possible.

In such a semiconductor device, when the formation position of the bit line contact 23 is partially overlapped on the element isolation region 6 by the cause such as the misalignment of positioning of the mask or the like, it must be made so that the bit line contact 23 does not enter the element isolation region 6. It is because this will cause a junction leak current in that portion, or the lowering of the element isolation breakdown voltage if the bit line contact 23 penetrates the element Isolation region 6.

In the present embodiment, since the second insulating film 26 has the resistance against the etching of the interlayer insulating film 27, the etching for forming a contact hole can be stopped once on the second insulating film 26.

In this way, after the contact hole reaching the portion above the second insulating film 26 is formed, the second insulating film 26 is etched by changing the conditions of etching and the first insulating film 25 and the gate oxide film 12 are etched by further changing the conditions, thereby forming the contact hole 30 of the portion located above the bit line contact diffusion layer 20.

Moreover, when the a silicon nitride film is used as the second insulating film 26, the silicon nitride film prevents boron, phosphorus and carbon contained in the interlayer insulating film 27 from diffusing into the element region. When such an impurity is diffused into the element region, it will cause the variation of the element characteristics. Since the diffusion coefficient is extremely small in the silicon nitride film, the diffusion can be blocked by the silicon nitride film.

Moreover, when an oxidization is performed after the formation of the second insulating film 26, there is a phenomenon that the diffusion of the impurities is accelerated and the distribution of the impurities is degraded when oxygen is diffused into the element region 5. However, since the diffusion of oxygen into the element region 5 can be prevented by employing a silicon nitride film for the second insulating film, the accelerated diffusion in the element region is prevented and the design of the distribution of the impurities can be facilitated.

Moreover, since the portion between the selecting gates 2 and in the vicinity of the bit line contact 23 is not completely embedded with the first insulating film 25, the film thickness of the first insulating film 25 at that portion is thinner than that of first insulating film 25 between the memory cell gates 13. Therefore, when the first insulating film 25 is etched for forming the bit line contact hole 30, even if the element isolation region is etched at the same time, the etching amount of the element isolation region can be suppressed small since the film thickness of the first insulating film 25 is thin.

That is, since at the time when the contact is formed, the interlayer insulating film 27 is selectively etched, the etching is stopped on the second insulating film 26. Then, the second insulating film 26 is selectively etched. Therefore, the first insulating film 25 is etched independent from the film thickness of the interlayer insulating film 27.

According to the method of manufacturing the semiconductor device of the present embodiment, the bit line contact can be formed with a high integration density and a good controllability, and the adverse influence due to hydrogen to the transistor characteristics can be prevented.

(Second Embodiment)

Figure 12:
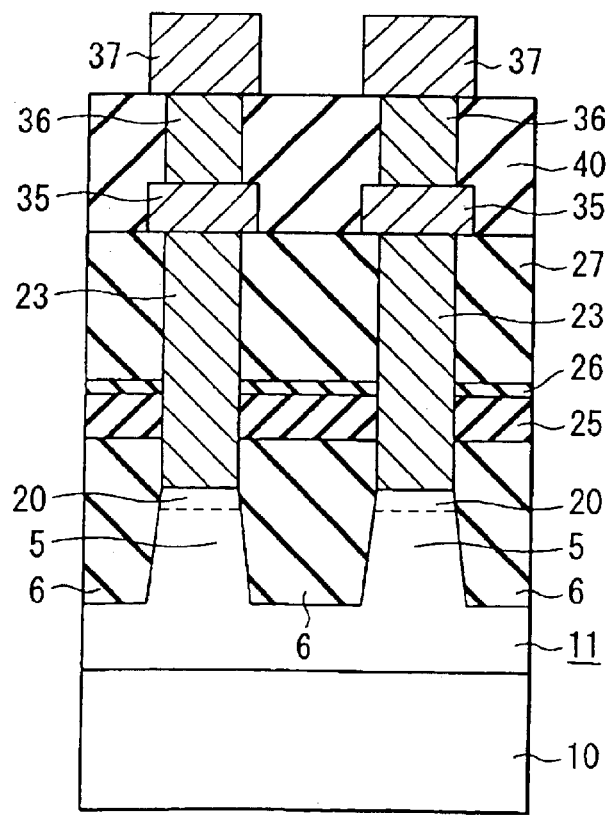
FIG. 12 is a cross sectional view taken along the line XII—XII in the plan view of FIG. 10 showing the semiconductor device according to the second embodiment of the present invention.
Figure 10:
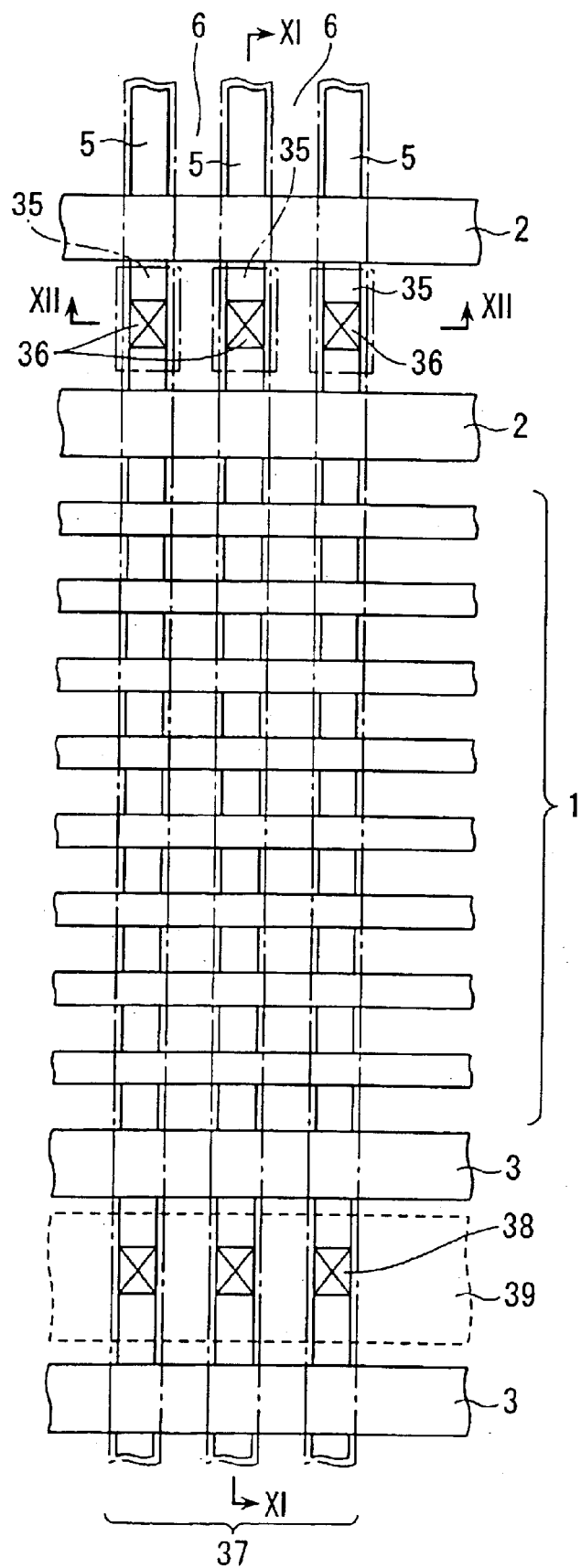
FIG. 10 is a plan view showing a semiconductor device according to a second embodiment of the present invention.
Figure 11:
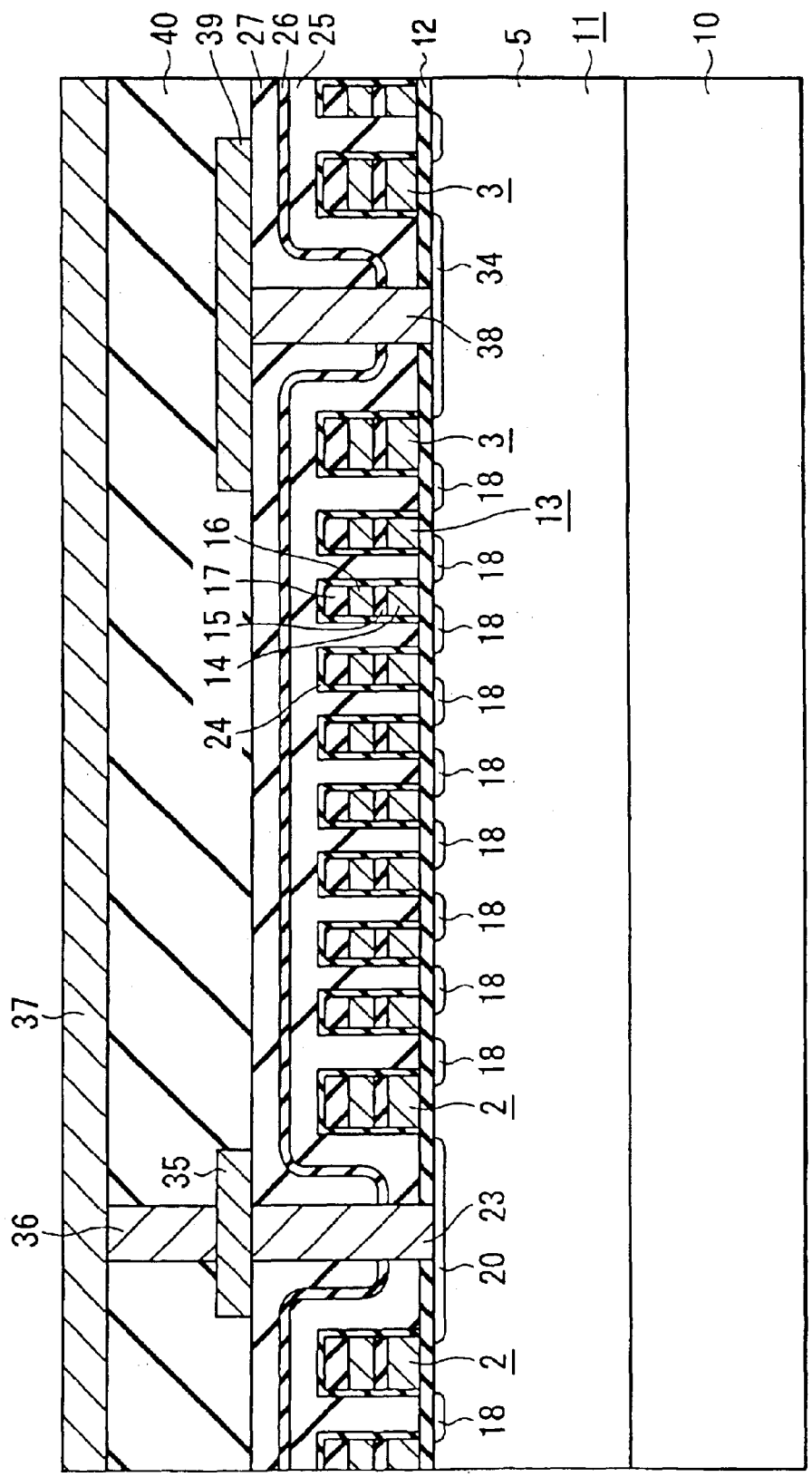
FIG. 11 is a cross sectional view taken along the line XI—XI in the plan view of FIG. 10 showing the semiconductor device according to the second embodiment of the present invention.

The second embodiment will be described below with reference to FIG. 10 through FIG. 12. FIG. 10 is a plan view showing a semiconductor device of the present embodiment. FIG. 11 is a view showing a cross section taken along the line XI—XI in FIG. 10, and FIG. 12 is a view showing a cross section taken along the line XII—XII in FIG. 10.

The present embodiment is different from the first embodiment in a form of drawing the bit line and the source line to the wiring. Since the forms in the other portions are similar to those of the first embodiment, the description will be omitted.

In the first embodiment, the bit line is connected to the wiring via the bit line contact from the source/drain diffusion layer, and the source line is formed of the source/drain diffusion layer commonly connected to the element regions adjacent each other.

In the present embodiment, as shown in FIG. 11, the bit line is connected from the bit line contact diffusion layer 20 via the via line contact 23 to a bit line connection section 35 by the first layer wiring, and further, via an inter-wiring contact 36 to a bit line 37 by the second layer wiring.

On the other hand, the source line is connect from a source line contact diffusion layer 34 via a source line contact 38 to a source line 39 by the first layer wiring, and is connected commonly to the memory cell arrays adjacent each other. This source line 39, the bit line connection section 35 and the inter-wiring contact 36 are covered with an inter-wiring insulating film 40, and the bit line 37 is formed on inter-wiring insulating film 40.

In a cross sectional view shown in FIG. 12, the plural element isolation regions 6 are formed so as to divide the upper surface of the element region 5 formed in the well 11 on the semiconductor substrate 10. The bit line contact 23 is connected to the entire element region 5 sandwiched between the element isolation regions 6.

The first insulating film 25 is formed on the element isolation region 6, and the second insulating film 26 is formed on the first insulating film 25. The interlayer insulating film 27 is formed on the second insulating film 26. The bit line contact 23 is formed in the interlayer insulating film 27, the second insulating film 26 and the first insulating film 25. The bit line contact 23 is connected to the bit line connection section 35, and further connected to the bit line 37 by the second layer wiring via the inter-wiring contact 36.

The bit line connection section 35 and the inter-wiring contact 36 are covered with the inter-wiring insulating film 40.

In general, the sheet resistance of a wiring is smaller than the sheet resistance of a diffuse layer, therefore, in the present embodiment, the electric resistance of the source line can be lowered than that of the first embodiment, and the high speed operation and the like are possible.

Although the source line contact is formed in the present embodiment, it is possible that the bit line contact is not provided. In this case, in the bit line section, the source/drain diffusion layers 20 of the element regions adjacent each other are commonly connected to each other, in the same manner as the source line in the first embodiment. In this case, the resistance of the source line can be reduced.

(Third Embodiment)

Figure 13:
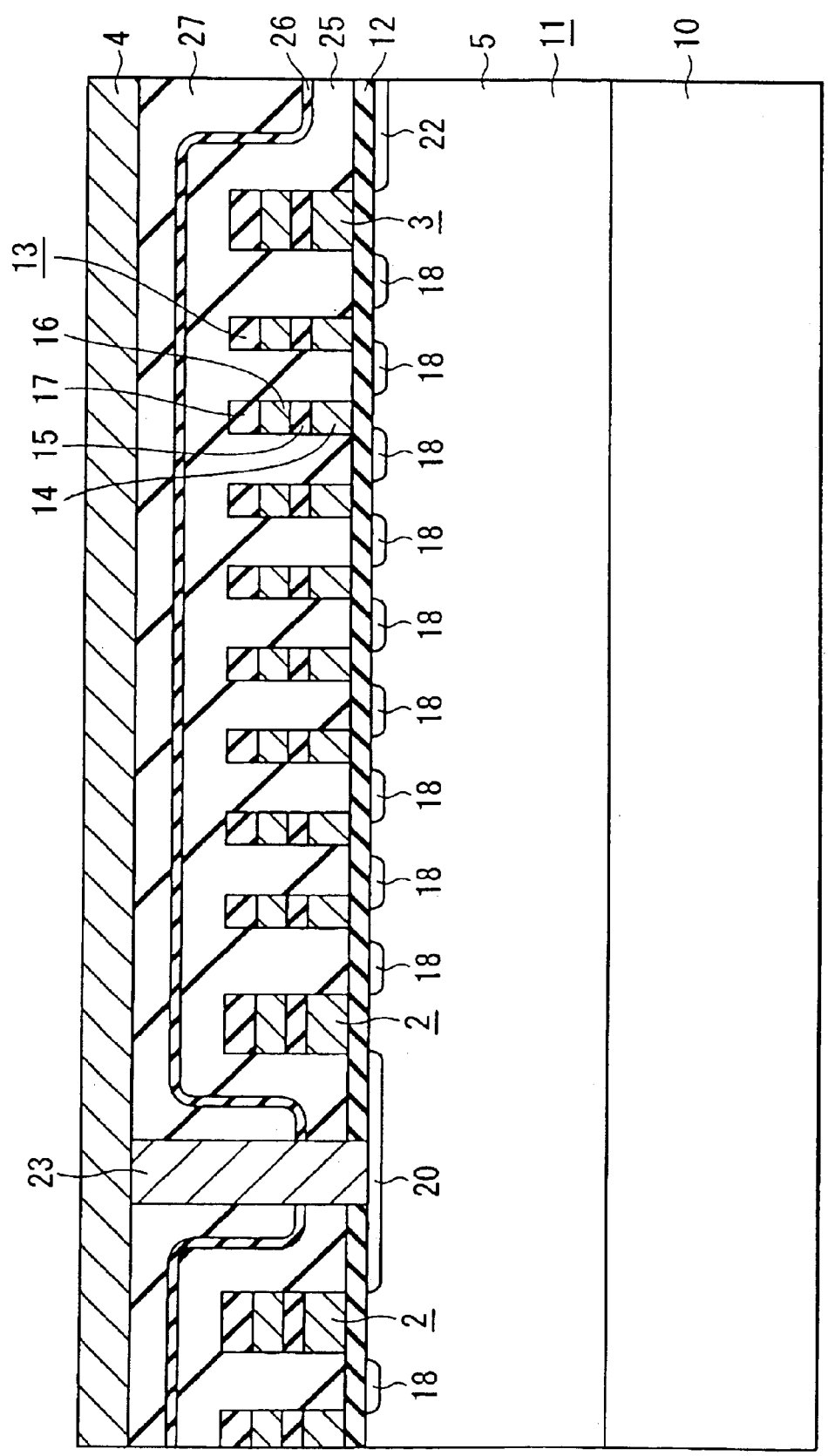
FIG. 13 is a cross sectional view showing a semiconductor device according to a third embodiment of the present invention.

FIG. 13 shows a cross sectional structure of the present embodiment. This cross sectional view corresponds to the cross sectional view taken along the line I—I in FIG. 3. However, it is different from the first embodiment in that the post-oxidization film is not formed on the side surfaces of the memory cell gate electrode 13, the drain side selecting gate 2, and the source side selecting gate 3. Specifically, in the present embodiment, the first insulating film 25 is formed without performing the post-oxidization after the gate electrode is processed. In this case, the first insulating film 25 functions as an oxide film instead of the post-oxidization film.

As for other structures except for ones described above, these are formed similar to the first embodiment.

Even in such configuration, the effects can be obtained similar to those of the first embodiment. The characteristics of which the post-oxidization film is not formed on the side surface of each gate electrode, which is one of the characteristics of the present embodiment can be also similarly applied to the second embodiment.

(Fourth Embodiment)

Figure 14:
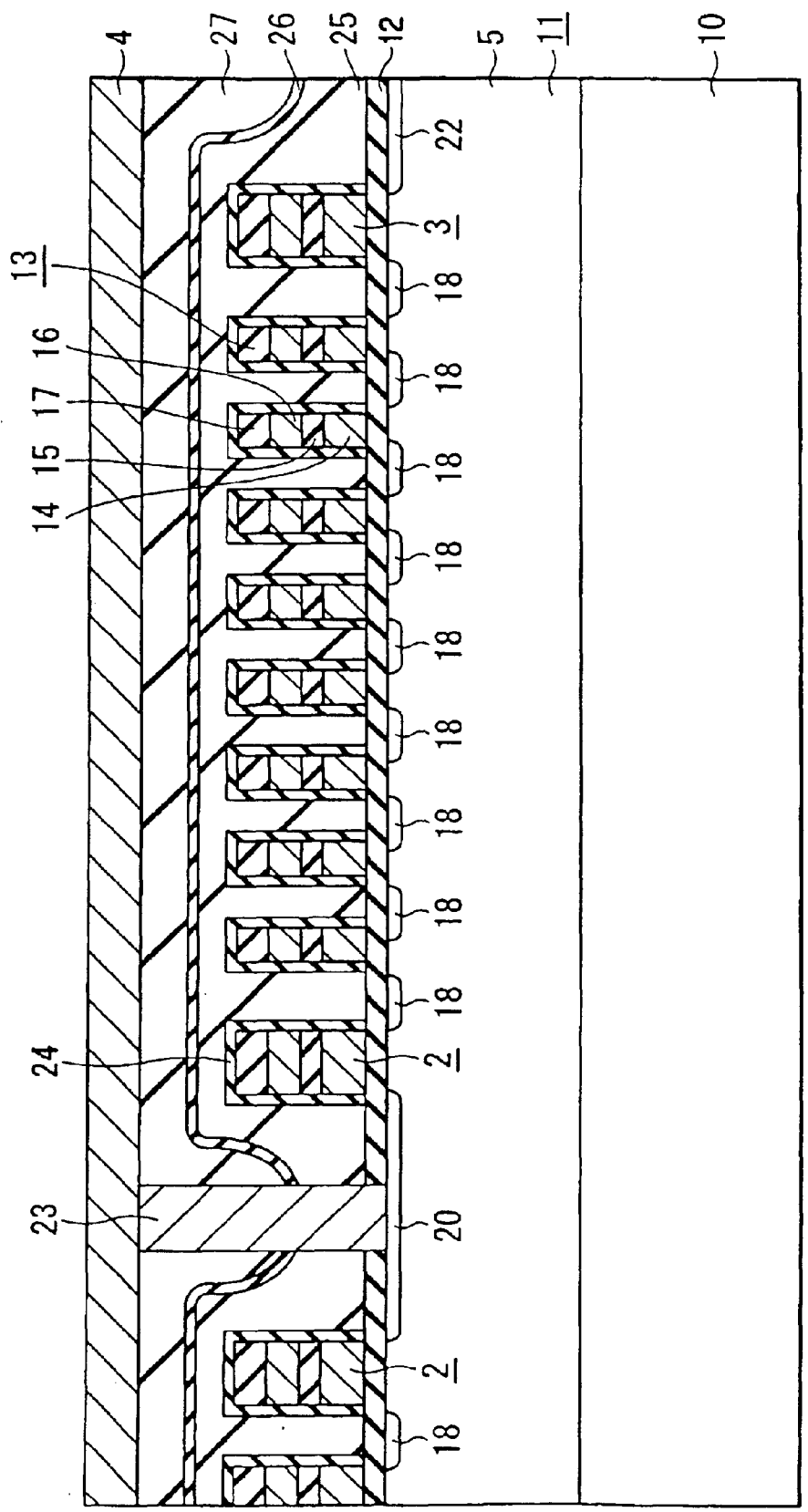
FIG. 14 is a cross sectional view showing a semiconductor device according to a fourth embodiment of the present invention.

FIG. 14 shows a cross sectional structure showing the fourth embodiment of the present invention. This cross sectional view corresponds to the cross sectional view taken along the line I—I in FIG. 3. However, it is different from the first embodiment in that the first insulating film 25 is formed as a soft curved surface on the bit line contact diffusion layer 20 and the source diffusion layer 22. Therefore, the second insulating film 26 on the first insulating film 25 is also formed on the first insulating film 25 in a shape corresponding to the shape of the first insulating film 25. Furthermore, the bottom surface of the interlayer insulating film 27 formed on the second insulating film 26 is in a shape corresponding to the second insulating film 26, and other structures except for these are similar to those of the first embodiment.

In a method of manufacturing of the present embodiment, in step shown in FIG. 6, after the first insulating film 25 is deposited, the first insulating film 25 is fluidized by adding the heat treatment, for example, in the range from about 800° C. to 900° C., the first insulating film 25 is embedded between the memory cell gate electrodes 13, between the memory cell gate electrode 13 and the drain side selecting electrode 2, between the memory cell gate electrode 13 and the source side selecting gate electrode 3, between the selecting gate electrodes 2, and between the selecting gate electrodes 3. In this case, the first insulating film 25 embedded between the selecting gate electrodes 2 is formed so as to be lower than the height of the selecting gate electrodes 2. Similarly, the first insulating film 25 embedded between the selecting gate electrodes 2 is formed so as to be lower than the height of the selecting gate electrodes 3.

Then, the second insulating film 26 is formed on the first insulating film 25.

In this way, by adding the step of, after the first insulating film 25 is deposited, fluidizing the first insulating film 25, the narrower portion between the gate electrodes can be embedded with the first insulating film 25 and the miniaturization of the element is possible.

That is, when the portion between the gate electrodes is small, the portion may be not embedded since a large cavity are made only if the insulating film is deposited. Here, the cavity may be embedded with the insulating film by fluidizing the insulating film by performing the heat treatment.

Moreover, when the gate electrode is formed in a significant height comparing to the distance between the gate electrodes, a large cavity is easily generated in the first insulating film between the gate electrodes, however, in the present embodiment, the cavity in the first insulating film thus generated can be embedded with the first insulating film.

In the present embodiment, although the film thickness of the first insulating film 25 on the gate electrode 13 of the memory cell transistor and the film thickness of the first insulating film 25 on the bit line contact diffusion layer 20 are different, the advantages can be obtained similar to those of the first embodiment.

The present embodiment can be also applied to the structure providing the source line contact like that of the second embodiment.

Moreover, the first insulating film 25 may be formed, for example, by a method of making the first insulating film in a shape like the present embodiment at the time of deposition, except for the method of fluidizing the first insulating film 25 by the heat treatment after the deposition.

(Fifth Embodiment)

Figure 15:
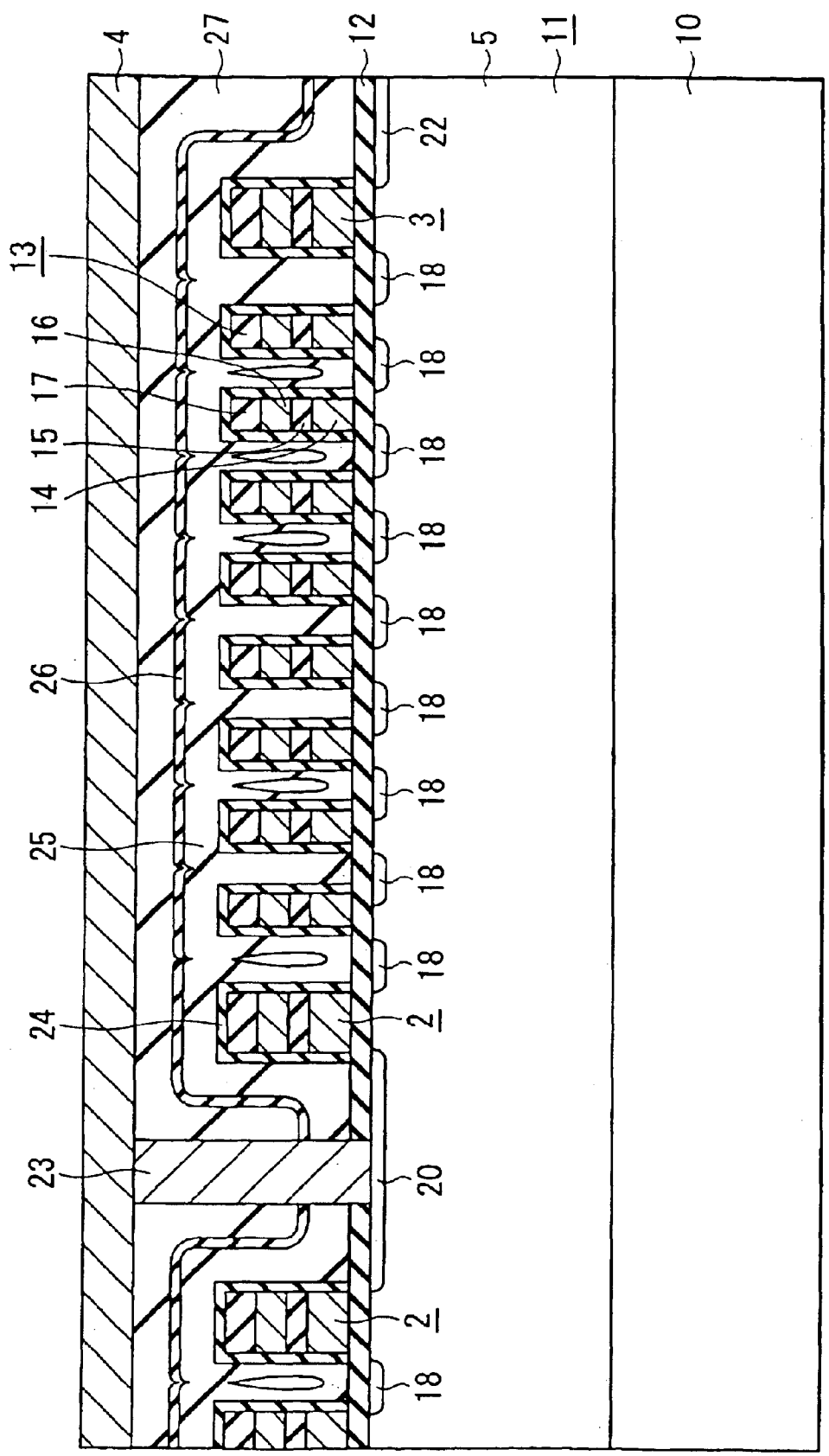
FIG. 15 is a cross sectional view showing a semiconductor device according to a fifth embodiment of the present invention.

FIG. 15 shows a cross sectional structure showing the fifth embodiment of the present invention. This cross sectional view corresponds to the cross sectional view taken along the line I—I in FIG. 3. However, It is different from the first embodiment in that some of the distance portions between the memory cell gates contain voids. In other words, some of the distance portions between the memory cell gates are completely embedded by the first insulating film, however, some other distance portions between the memory cell gates are not completely embedded by the first insulating film and contain voids. For example, after forming the gates, when the first insulating film 25 are deposited by LPCVD (low pressure chemical vapor deposition), the space portions between the gates may not be completely embedded by the first insulating film 25 and may contain the voids. With this embodiment, similar advantages as in the described embodiments can be obtained.

(Sixth Embodiment)

Figure 16:
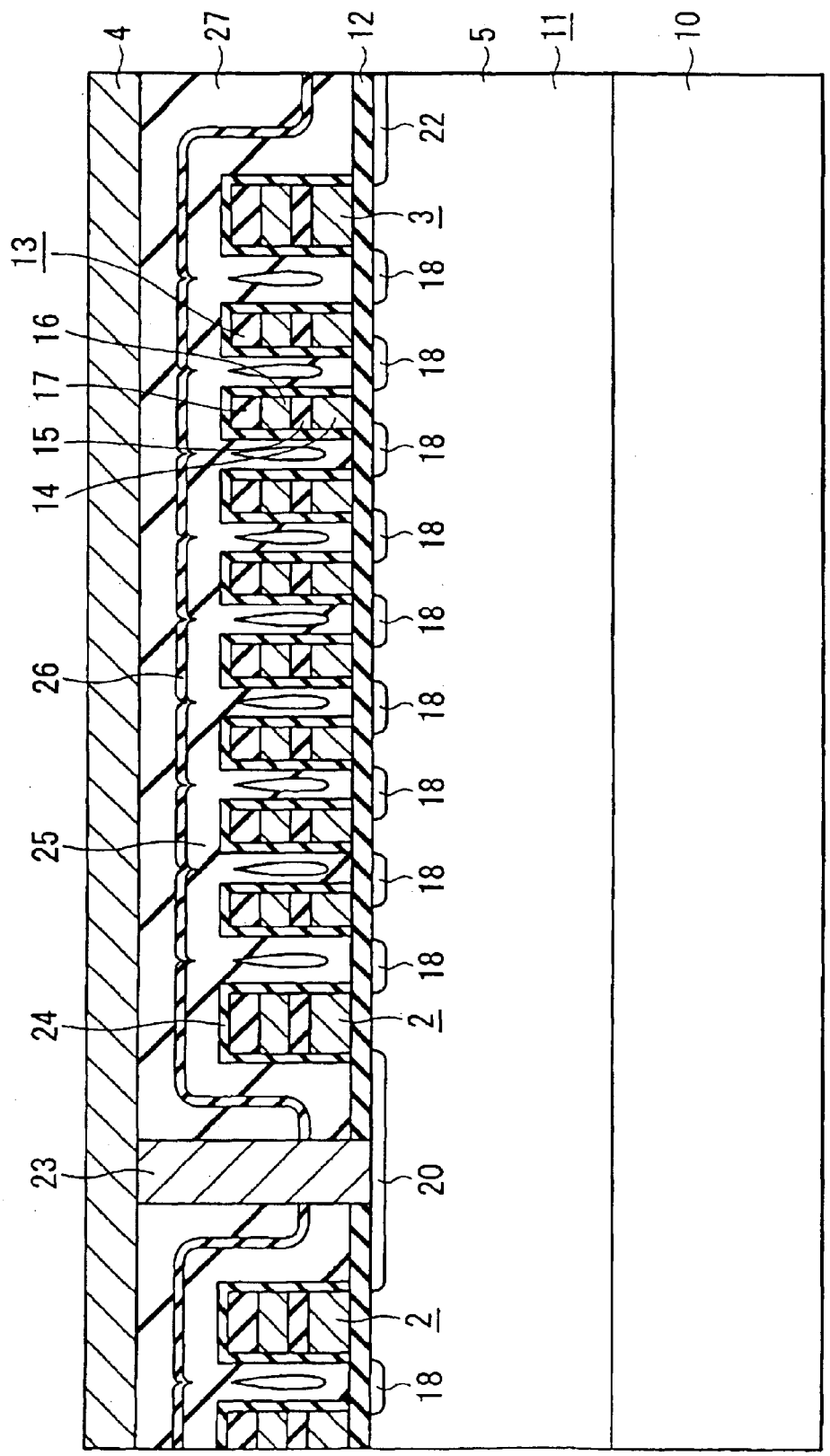
FIG. 16 is a cross sectional view showing a semiconductor device according to a sixth embodiment of the present invention.

FIG. 16 shows a cross sectional structure showing the sixth embodiment of the present invention. This cross sectional view corresponds to the cross sectional view taken along the line I—I in FIG. 3. However, it is different from the first embodiment in that all of the distance portions between the memory cell gates contain voids. In other words, no distance portions between the memory cell gates is completely embedded by the first insulating film. However, with this embodiment, similar advantages as in the described embodiments can be obtained.

(Seventh Embodiment)

Figure 17:
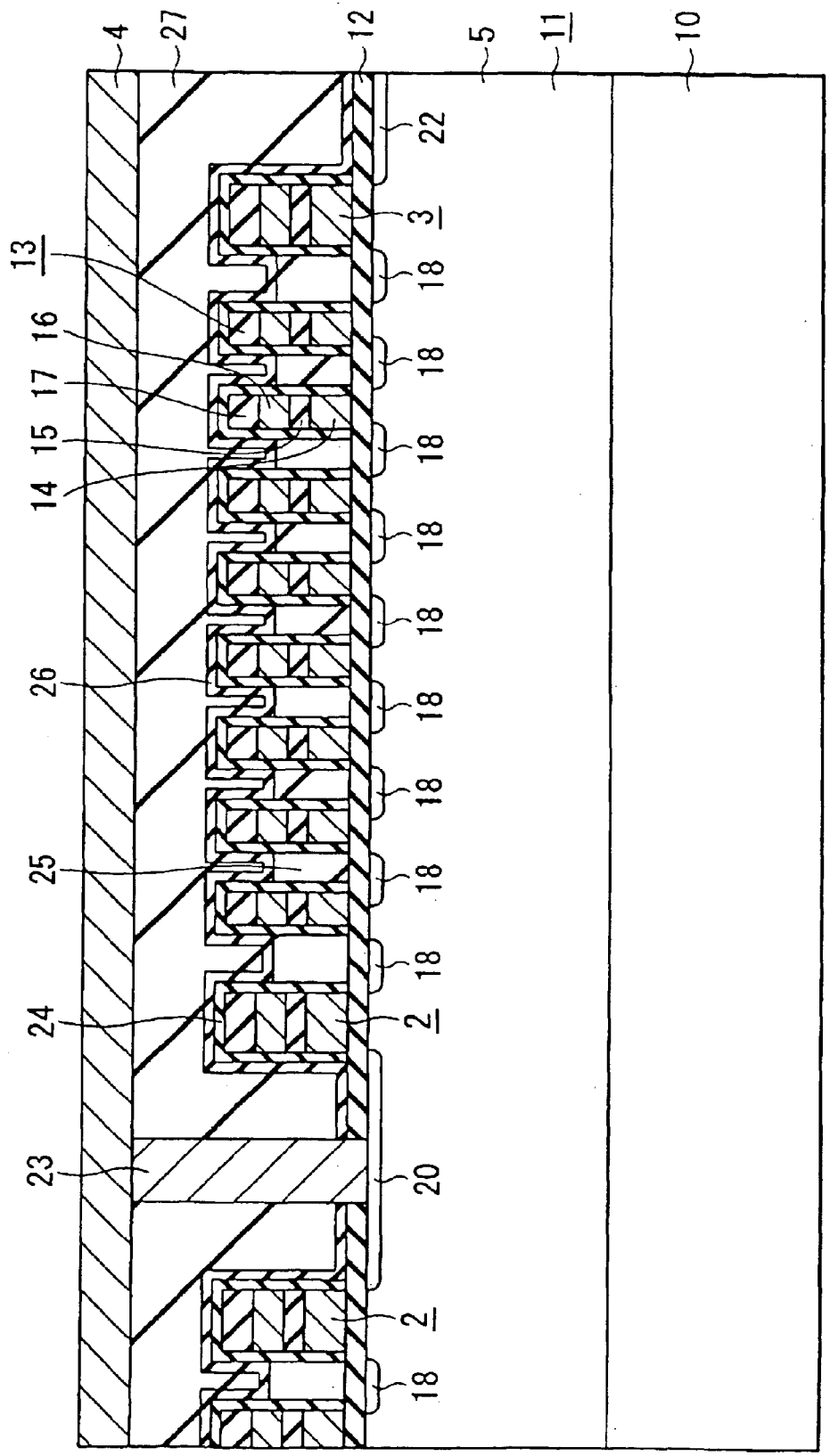
FIG. 17 is a cross sectional view showing a semiconductor device according to a seventh embodiment of the present invention.

FIG. 17 shows a cross sectional structure showing the seventh embodiment of the present invention. This cross sectional view corresponds to the cross sectional view taken along the line I—I in FIG. 3. However, it is different from the first embodiment in that the distance portions between the memory cell gates are not embedded by the first insulating film 25 to a height equal to a height of the memory cell gates, but to a height in the middle of the memory cell gates. However, with this embodiment, similar advantages as in the described embodiments can be obtained.

(Eighth Embodiment)

Figure 18:
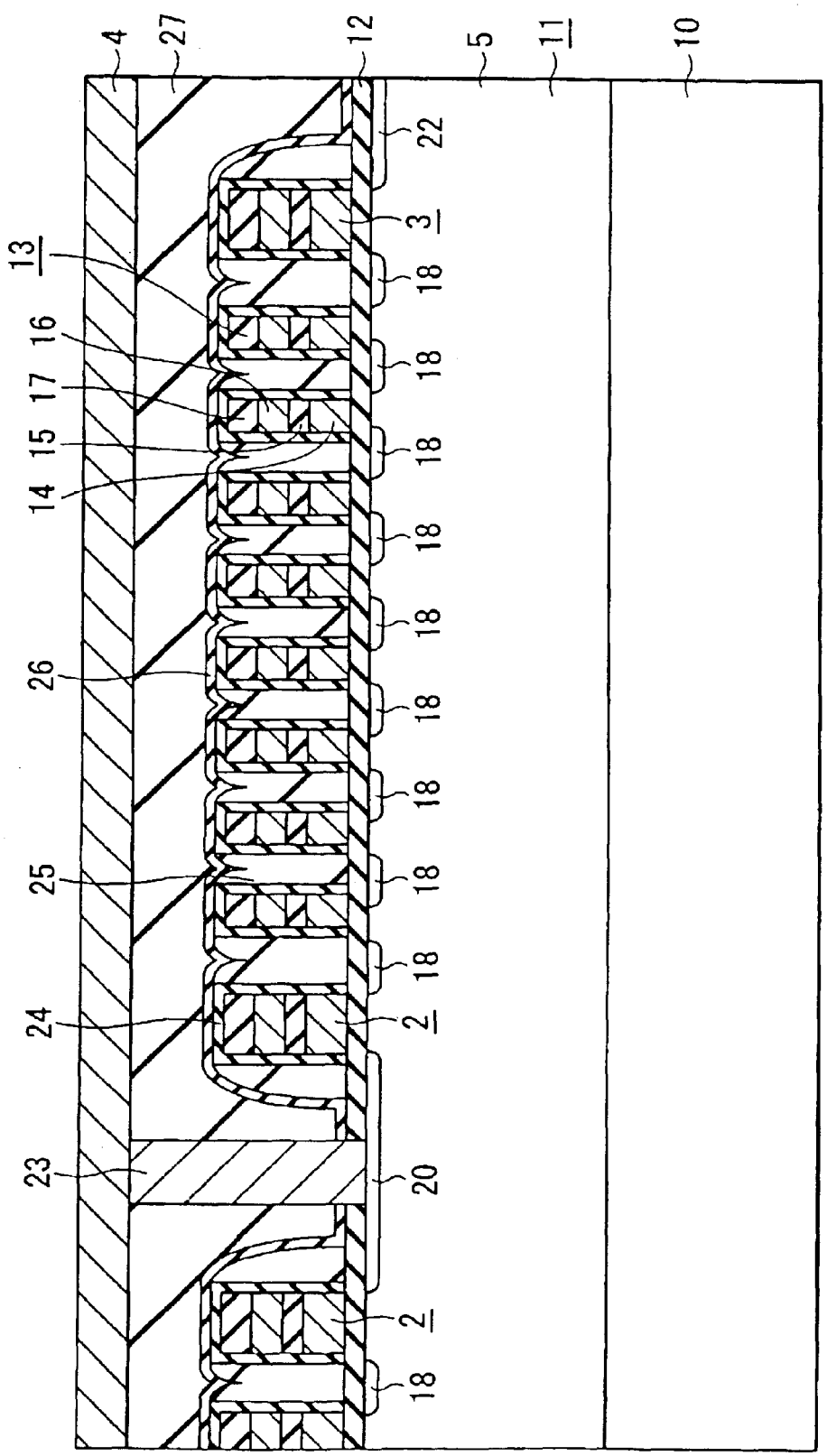
FIG. 18 is a cross sectional view showing a semiconductor device according to an eighth embodiment of the present invention.
Figure 19:
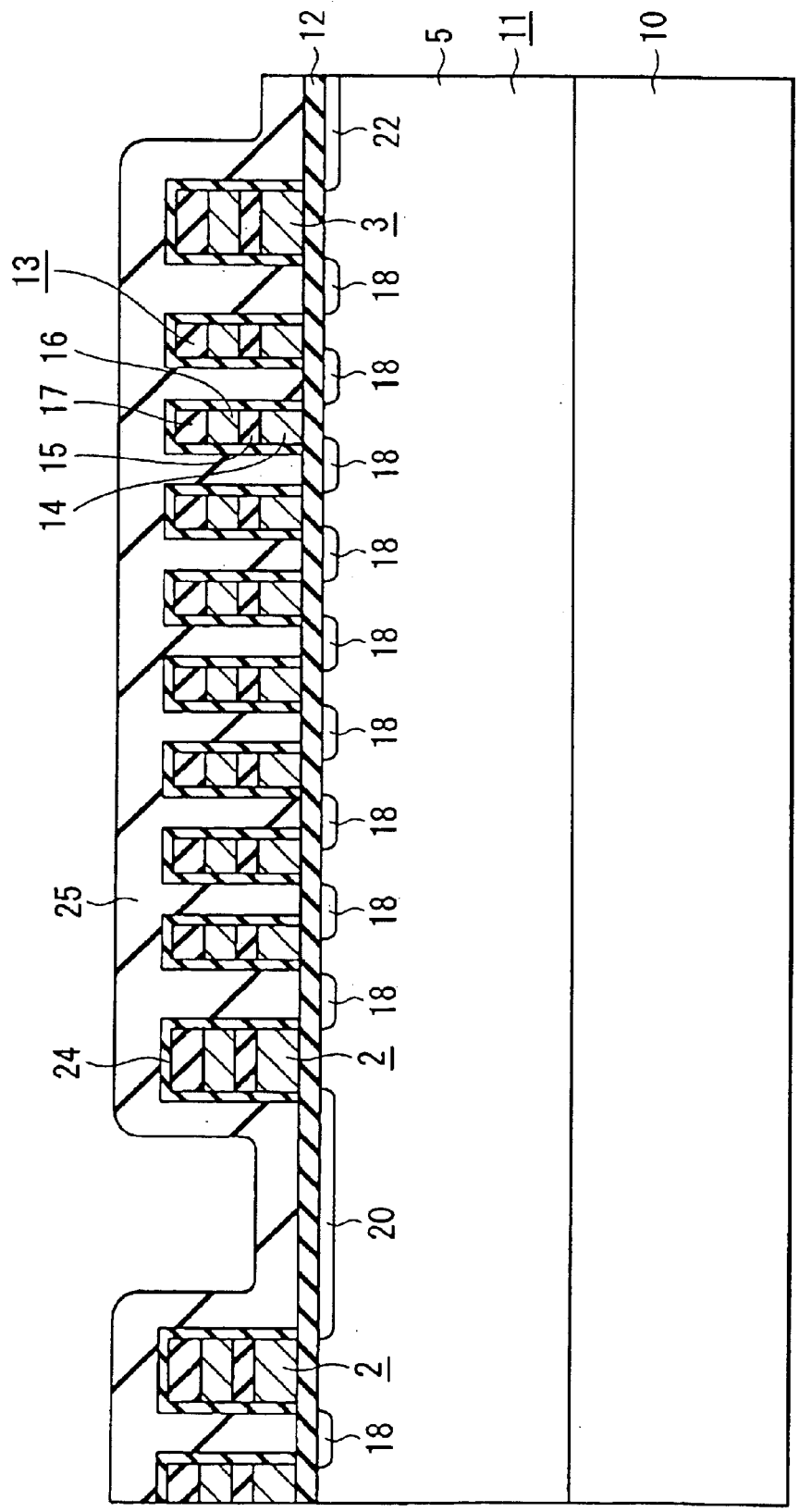
FIG. 19 is a cross sectional view showing one step of the method of manufacturing the semiconductor device according to the eighth embodiment of the present invention.
Figure 20:
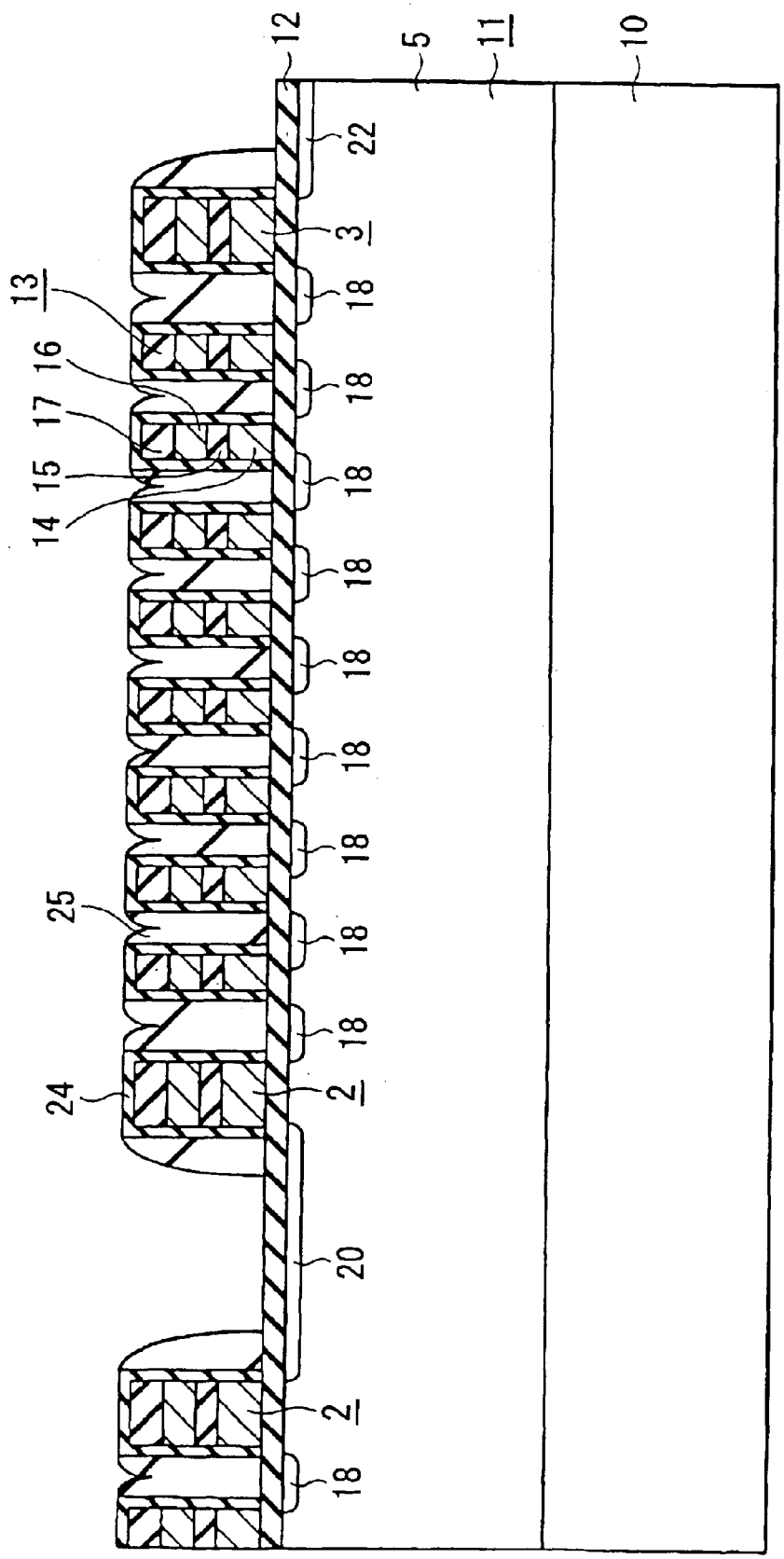
FIG. 20 is a cross sectional view showing one step of the method of manufacturing the semiconductor device according to the eighth embodiment of the present invention.

FIG. 18 shows a cross sectional structure showing the eighth embodiment of the present invention. This cross sectional view corresponds to the cross sectional view taken along the line I—I in FIG. 3. However, it is different from the first embodiment in that the first insulating film 25 is provided on the side surfaces of the gates. To realize this configuration, after forming the gates, the first insulating film 25 is formed, as shown in FIG. 19. Then, the first insulating film 25 is subjected to etch-back by an unisotropic etching such as RIE (reactive ion etching), as shown in FIG. 20. With this embodiment, similar advantages as in the described embodiments can be obtained.

(Ninth Embodiment)

Figure 21:
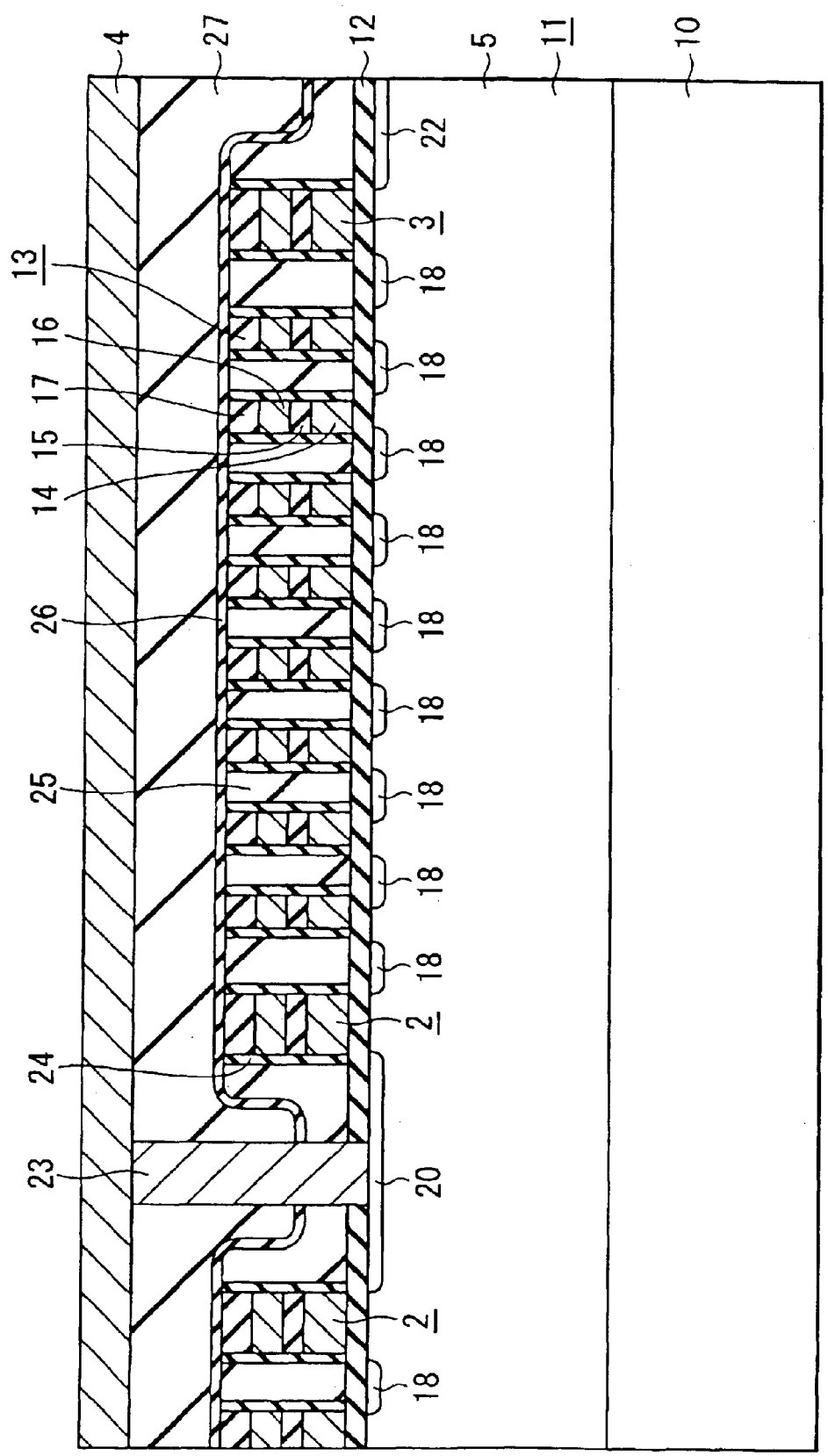
FIG. 21 is a cross sectional view showing a semiconductor device according to a ninth embodiment of the present invention.
Figure 22:
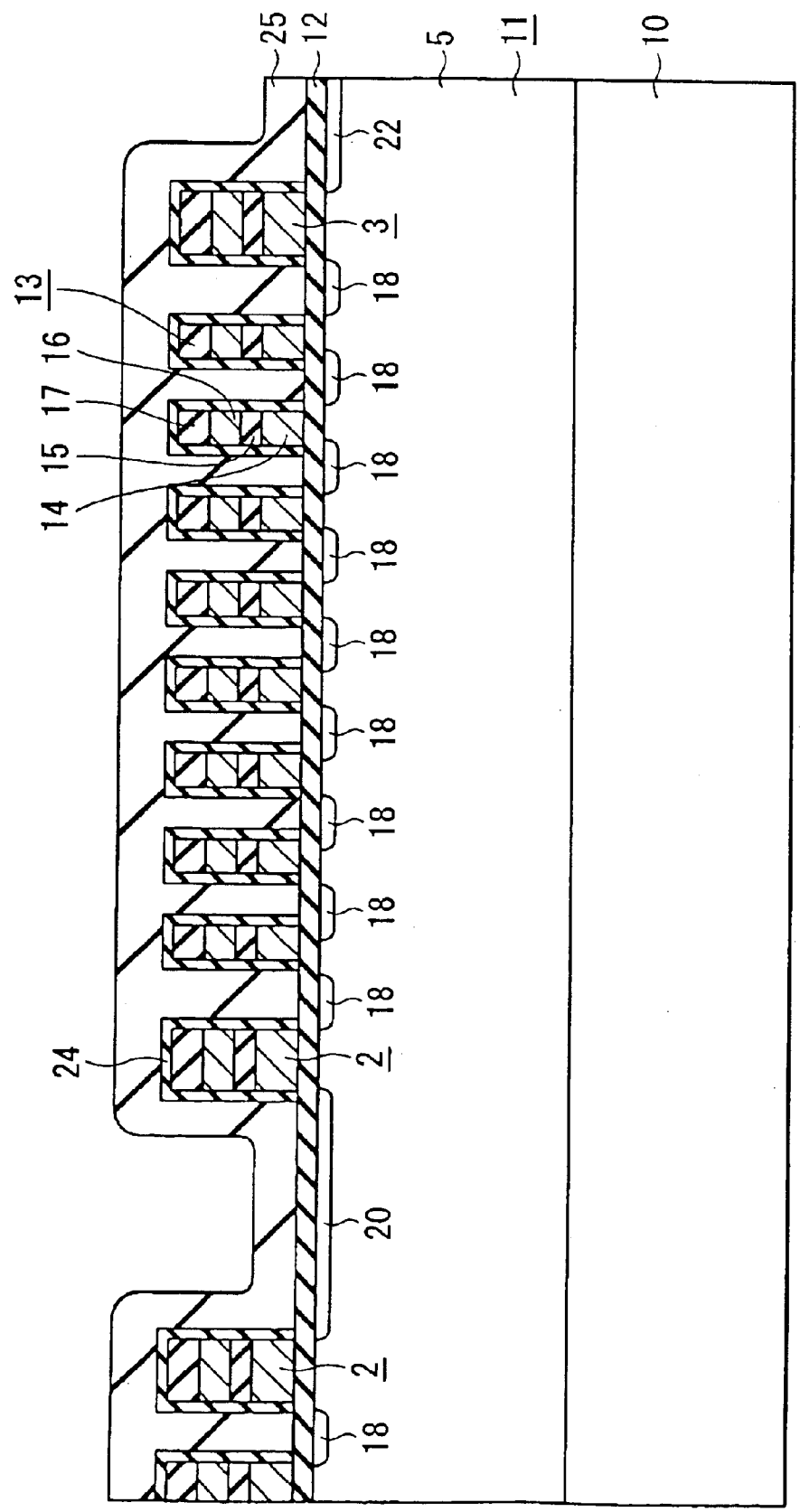
FIG. 22 is a cross sectional view showing one step of the method of manufacturing the semiconductor device according to the ninth embodiment of the present invention.
Figure 23:
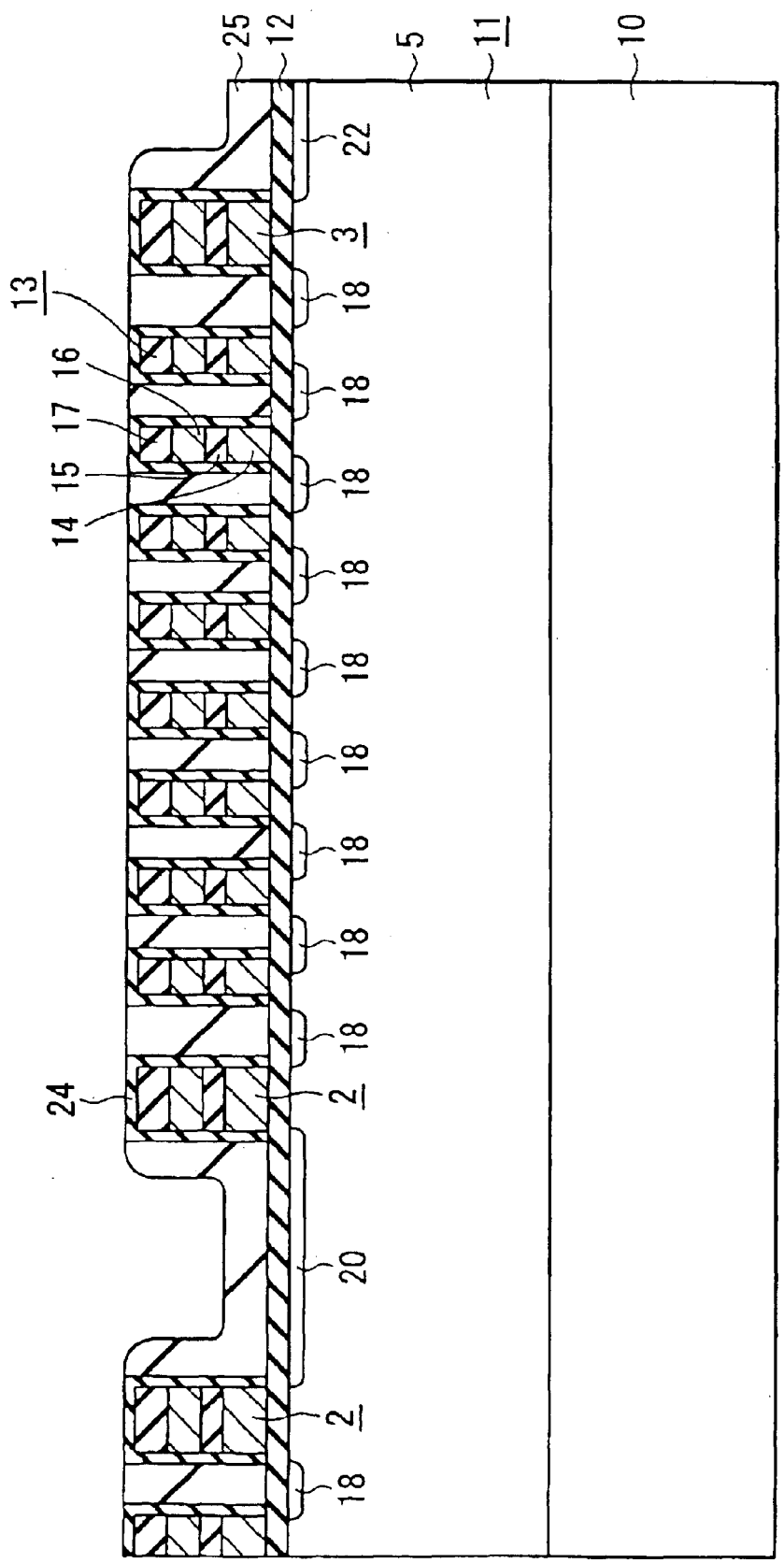
FIG. 23 is a cross sectional view showing one step of the method of manufacturing the semiconductor device according to the ninth embodiment of the present invention.

FIG. 21 shows a cross sectional structure showing the eighth embodiment of the present invention. This cross sectional view corresponds to the cross sectional view taken along the line I—I in FIG. 3. However, it is different from the first embodiment in that the first insulating film 25 does not remain on the upper surfaces of the gates. That is, no first insulating film is provided on the upper surfaces of the gates. To realize this configuration, after the first insulating film 25 is formed, as shown in FIG. 22, a CMP (chemical mechanical polishing) process is performed to polish the first insulating film 25 until the upper surfaces of gates are exposed, as shown in FIG. 23. With this embodiment, similar advantages as in the described embodiments can be obtained.

(Tenth Embodiment)

Figure 24:
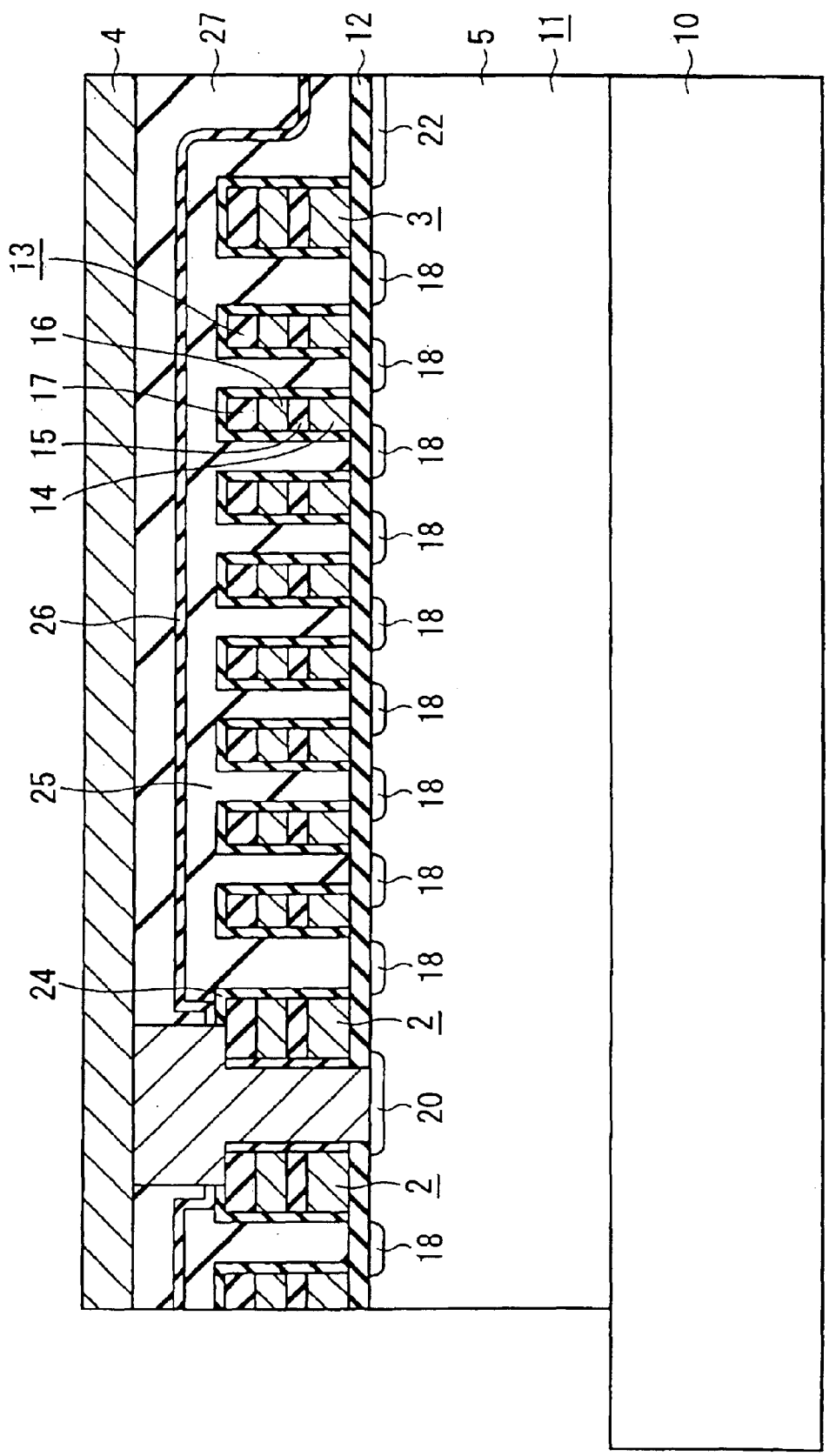
FIG. 24 is a cross sectional view showing a semiconductor device according to a tenth embodiment of the present invention.
Figure 25:
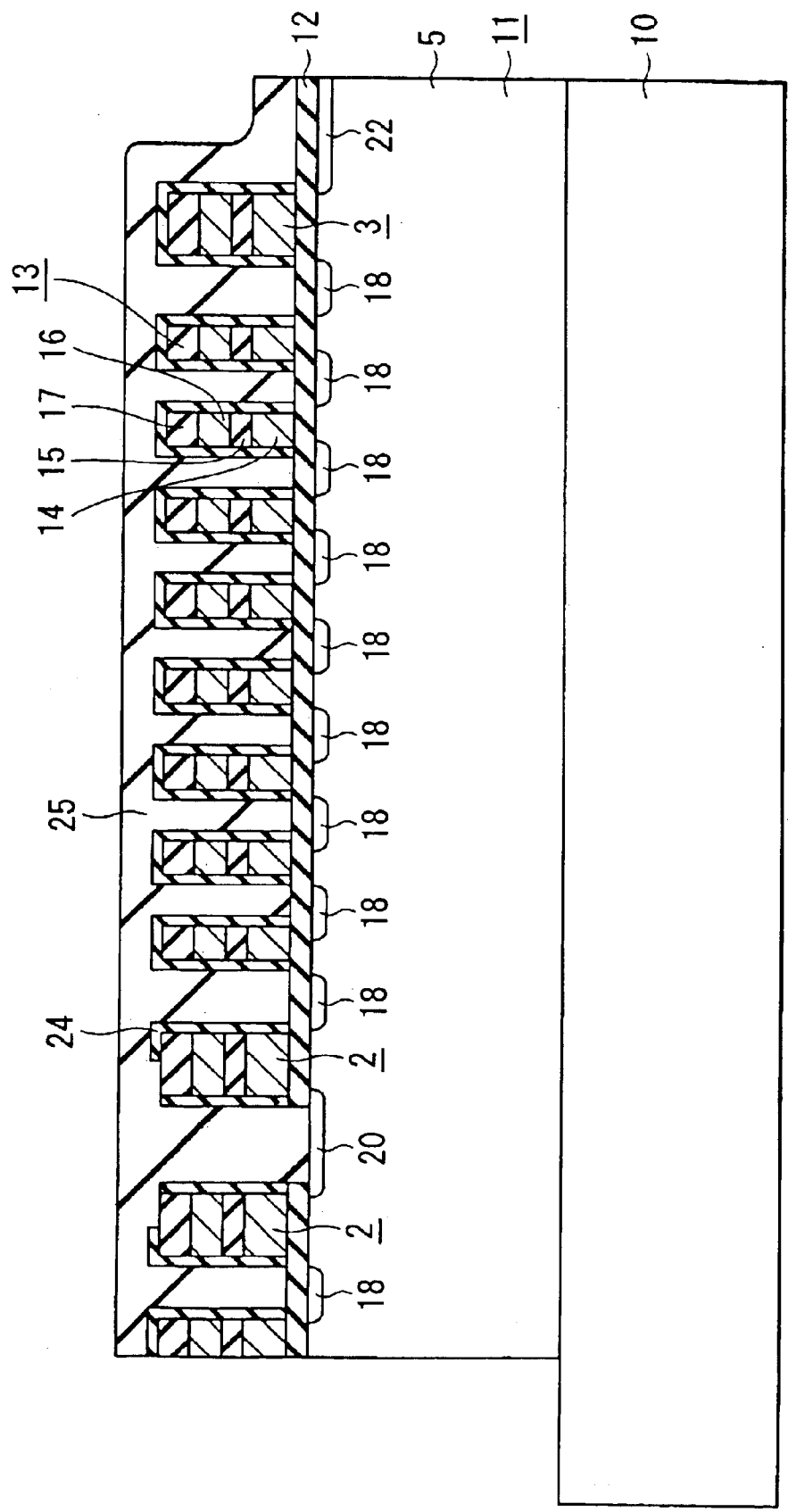
FIG. 25 is a cross sectional view showing one step of the method of manufacturing the semiconductor device according to the tenth embodiment of the present invention.
Figure 26:
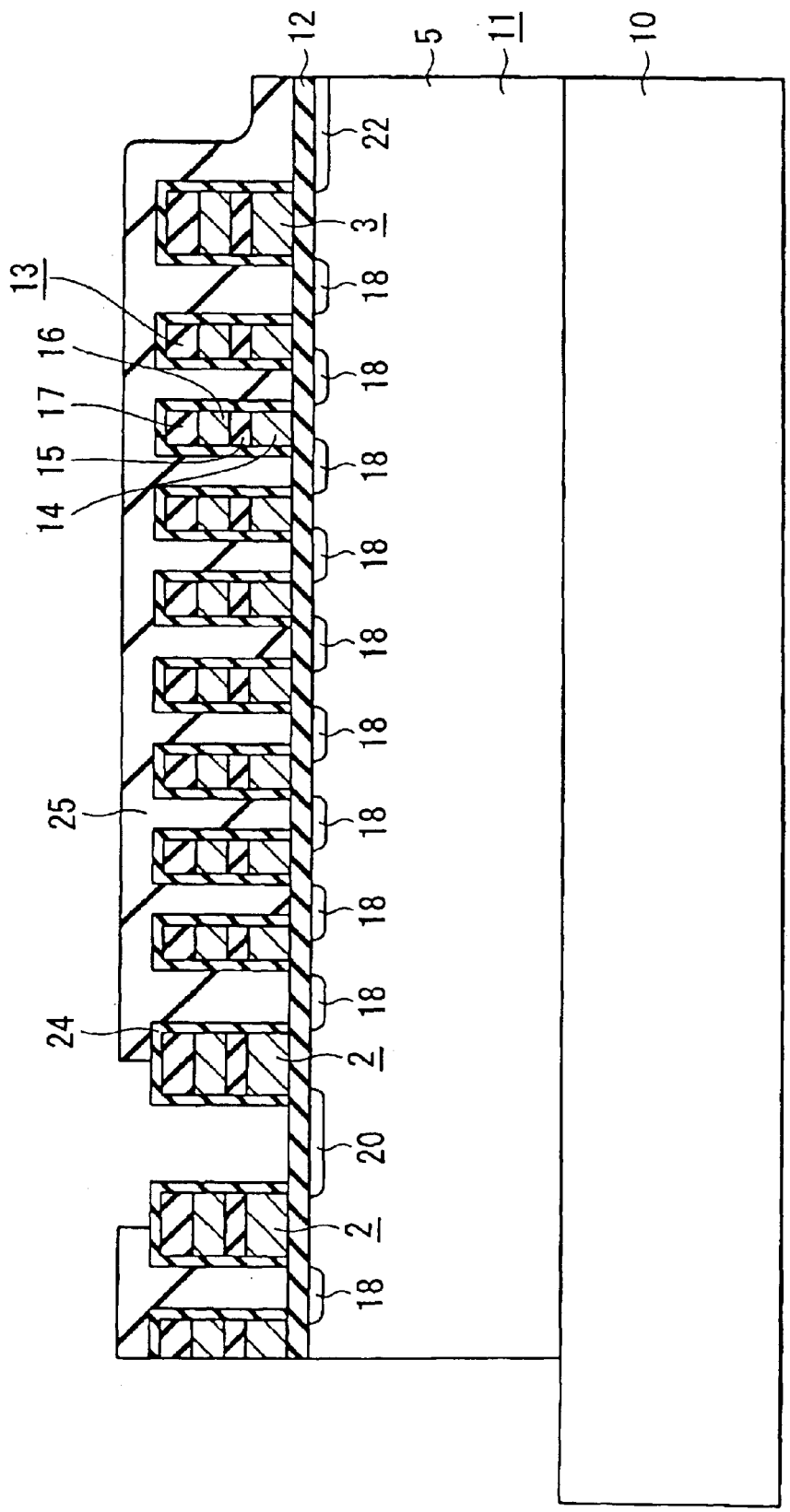
FIG. 26 is a cross sectional view showing one step of the method of manufacturing the semiconductor device according to the tenth embodiment of the present invention.
Figure 27:
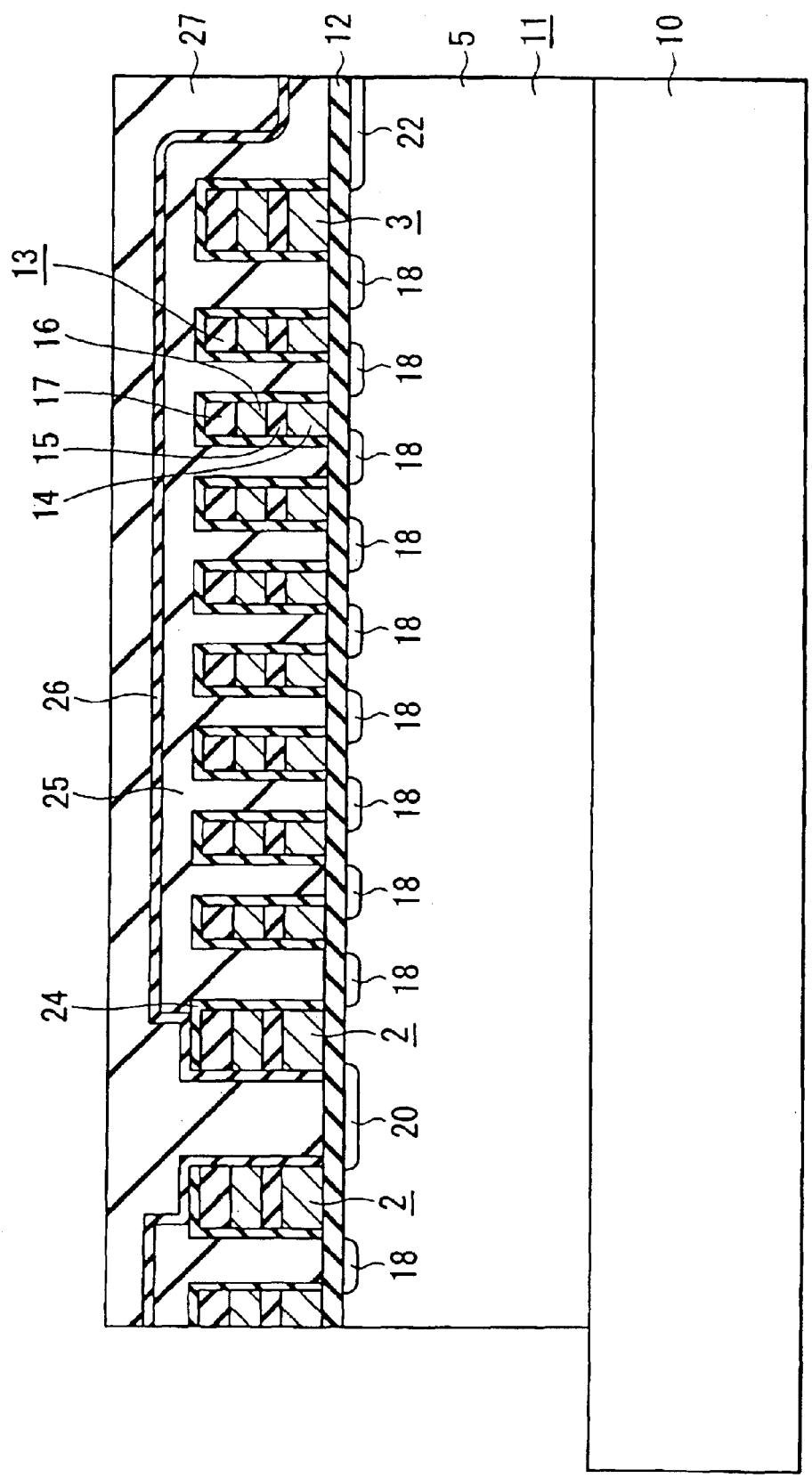
FIG. 27 is a cross sectional view showing one step of the method of manufacturing the semiconductor device according to the tenth embodiment of the present invention.
Figure 28:
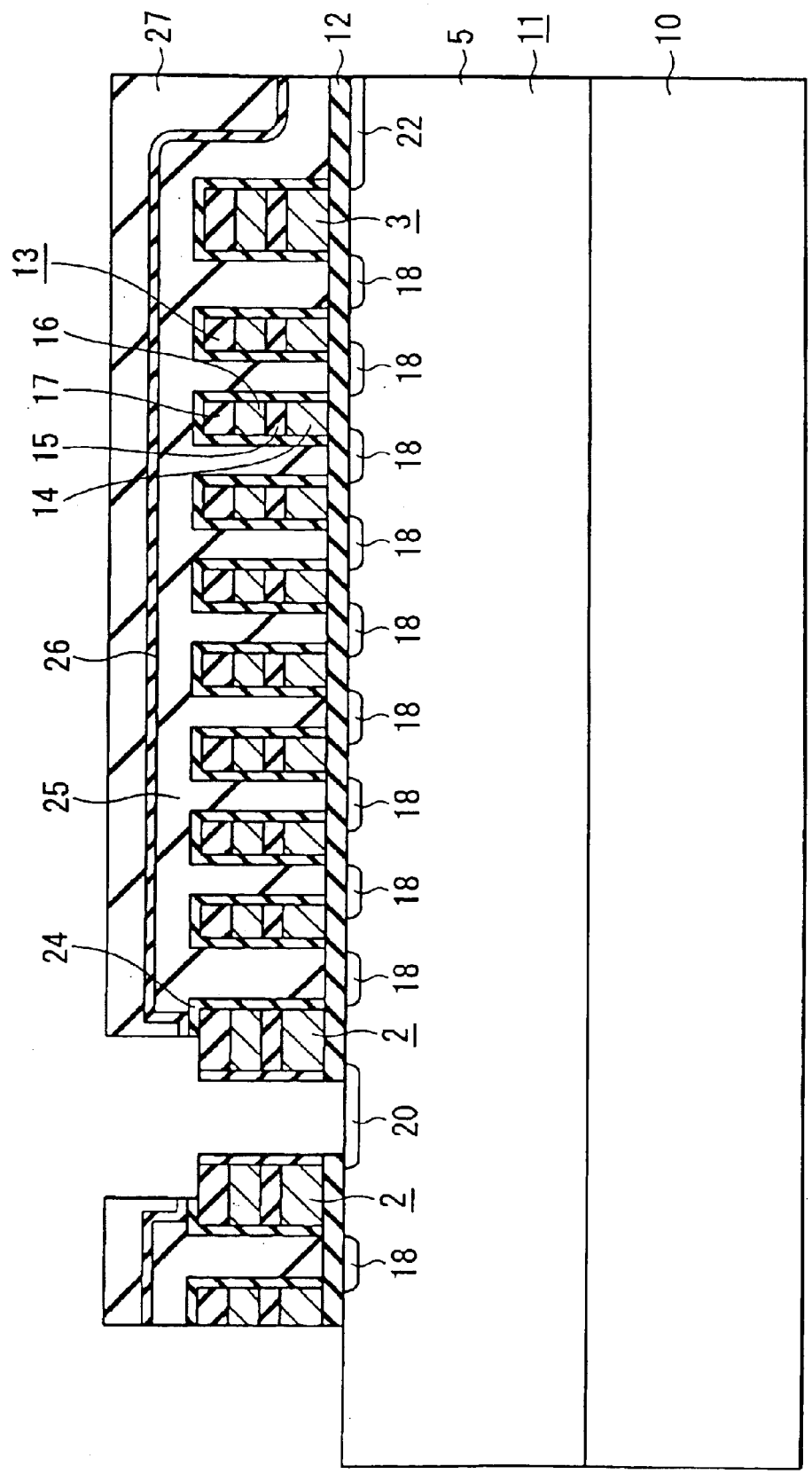
FIG. 28 is a cross sectional view showing one step of the method of manufacturing the semiconductor device according to the tenth embodiment of the present invention.

FIG. 24 shows a cross sectional structure showing the tenth embodiment of the present invention. This cross sectional view corresponds to the cross sectional view taken along the line I—I in FIG. 3. However, it is different from the first embodiment in that the bit line contact has a self-alignment structure. That is, the bit line contact is self-aligned with the drain side selecting gate. To realize this configuration, after the gates are formed and then the first insulating film 25 is formed, as shown in FIG. 25, a portion of the first insulating film 25, in which the bit line contact is to be formed, is etched by a photo-lithography method, as shown in FIG. 26. After that, as shown in FIG. 27, the second insulating film 26 and the interlayer insulating film 27 are formed. Subsequently, as shown in FIG. 28, a contact hole fox the bit line contact is formed in the gate insulating film 12, the second insulating film 26 and the interlayer insulating film 27 in self-aligned with the drain side selecting gate, and then, the bit line contact is formed in the contact hole. With this embodiment, similar advantages as in the described embodiments can be obtained. Also, with this embodiment, the distance between the selecting gates is shortened, resulting in reduction of the element size.

In the semiconductor devices, a parasitic capacitance is created between the floating gate electrodes of adjacent gates. The adjacent memory cell transistors are involved in interference due to the parasitic capacitance. To reduce the interference, it is desirable that the parasitic capacitance be as small as possible. As recent advancement of miniaturization of semiconductor elements, the distance between the adjacent gates is small and thus the influence of the parasitic capacitance is remarkable.

Figure 29:
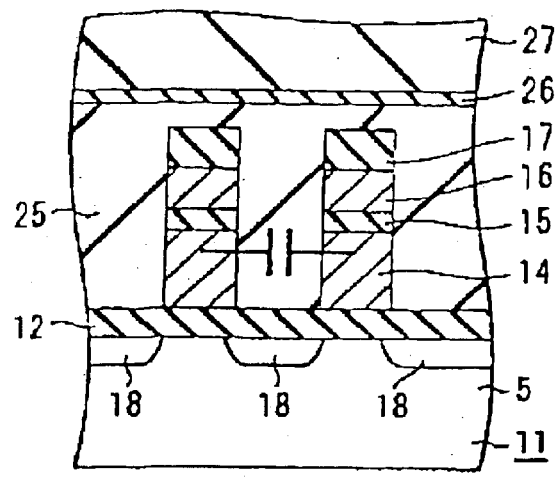
FIG. 29 is a cross sectional view showing a portion of a semiconductor device according to an embodiment of the present invention.

In the embodiments, as shown in FIG. 29, when the first insulating layer 25 embedded between the gates is made of silicon oxide, the parasitic capacitance between the gates is small. Specifically, the specific dielectric constant of a silicon oxide film is smaller than that of a silicon nitride film used in a conventional semiconductor device. Hence, even if the distances between the gazes is the same, the parasitic capacitance between the gates in the semiconductor device of the embodiments is smaller than that of the conventional semiconductor device in which a silicon nitride film is used.

Figure 30:
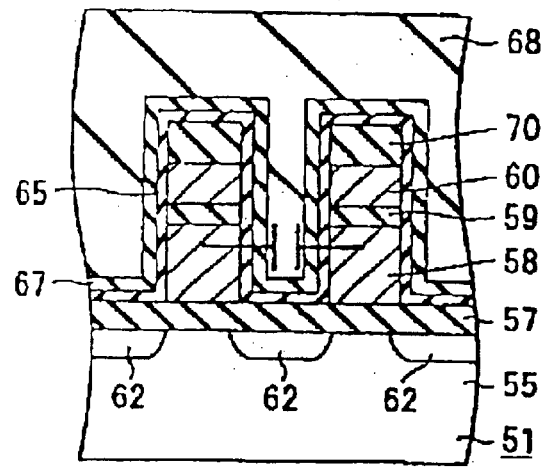
FIG. 30 is a cross-sectional view showing a portion of a conventional semiconductor device.
Figure 32:
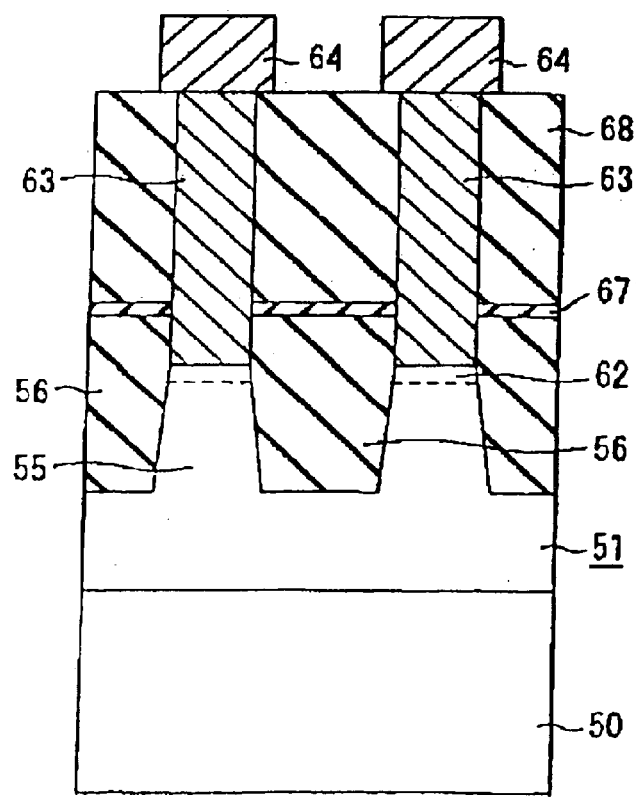
FIG. 32 is a cross sectional view taken along the line XXXII—XXXII in a plan view of FIG. 33 showing the conventional semiconductor device.
Figure 31:
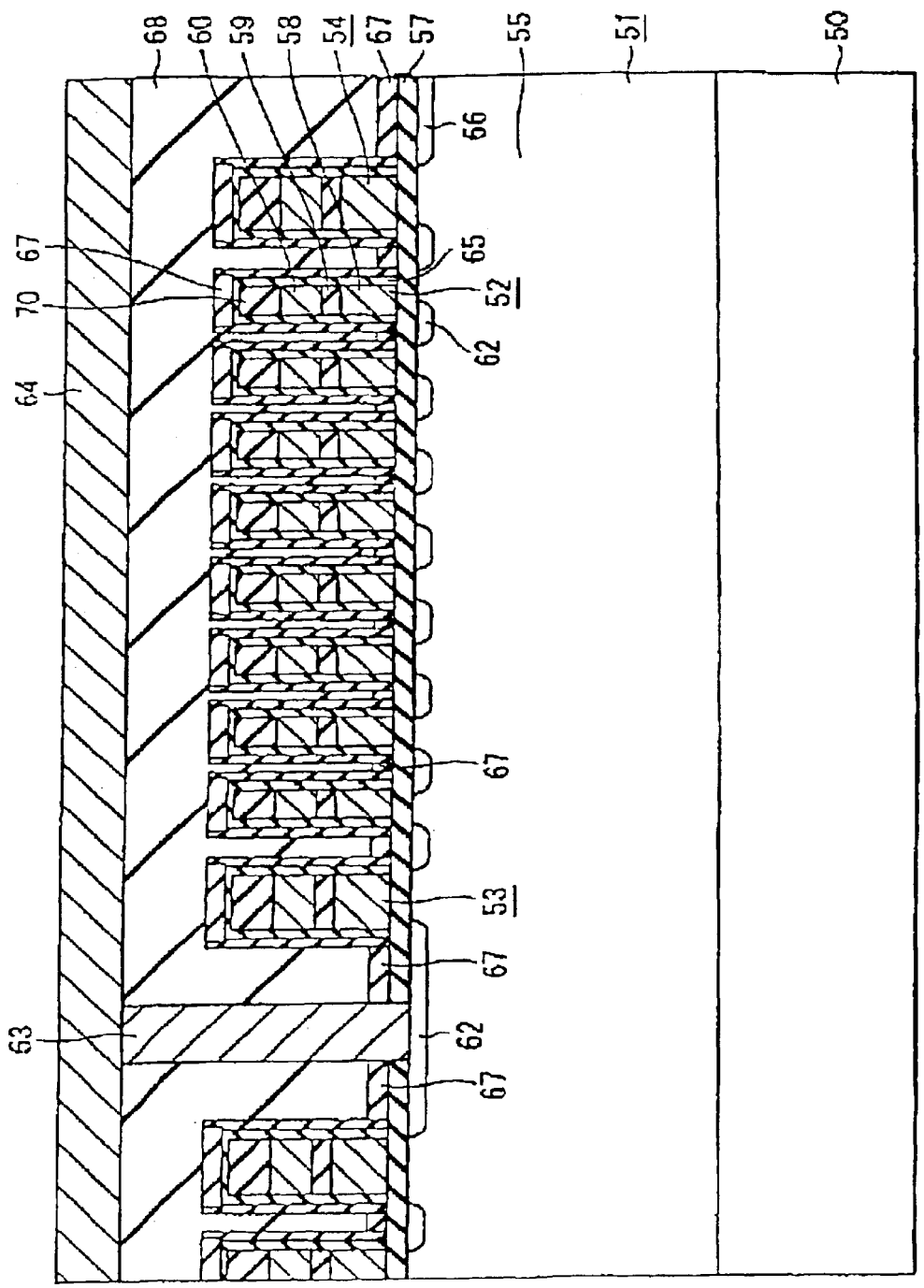
FIG. 31 is a cross sectional view taken along the line XXXI—XXXI in a plan view of FIG. 33 showing a conventional semiconductor device.
Figure 33:
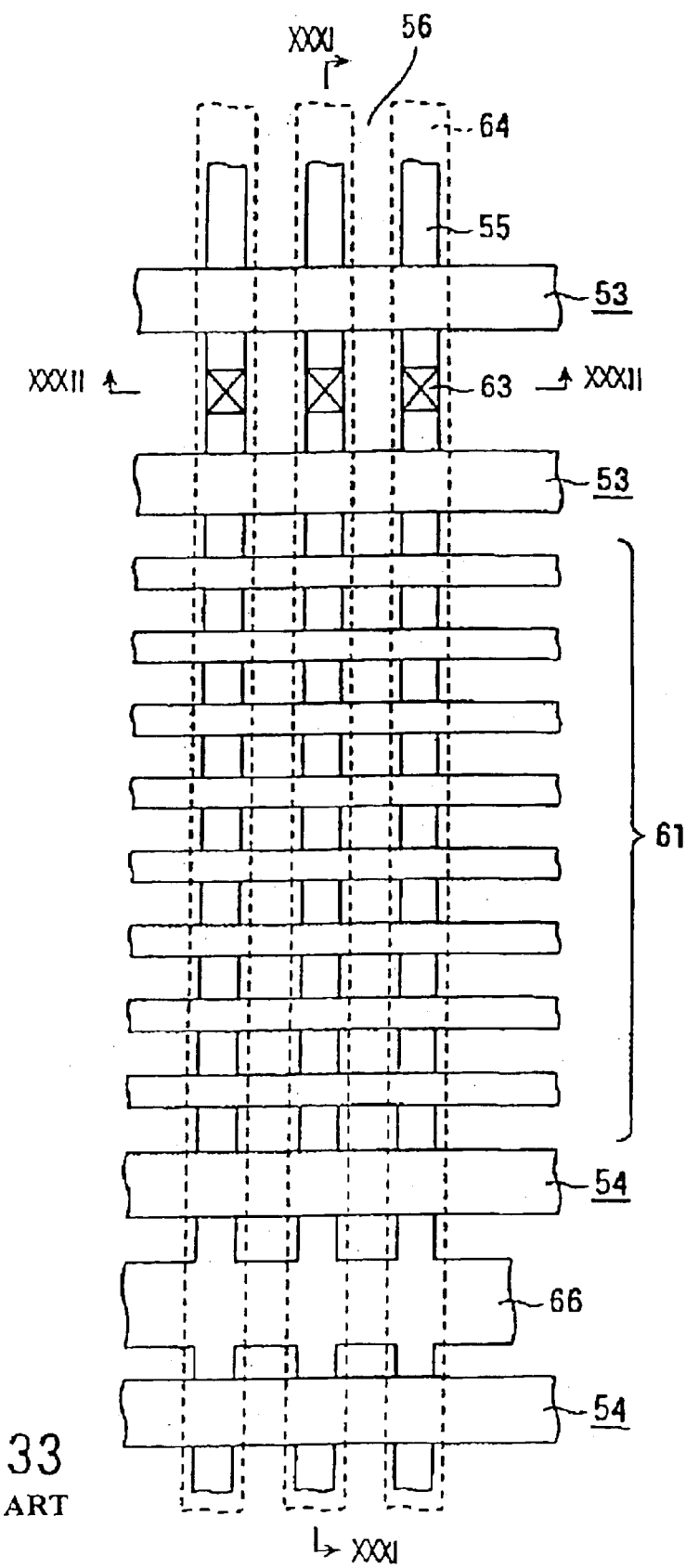
FIG. 33 is a plan view showing the conventional semiconductor device shown in FIGS. 31 and 32.
Figure 34:
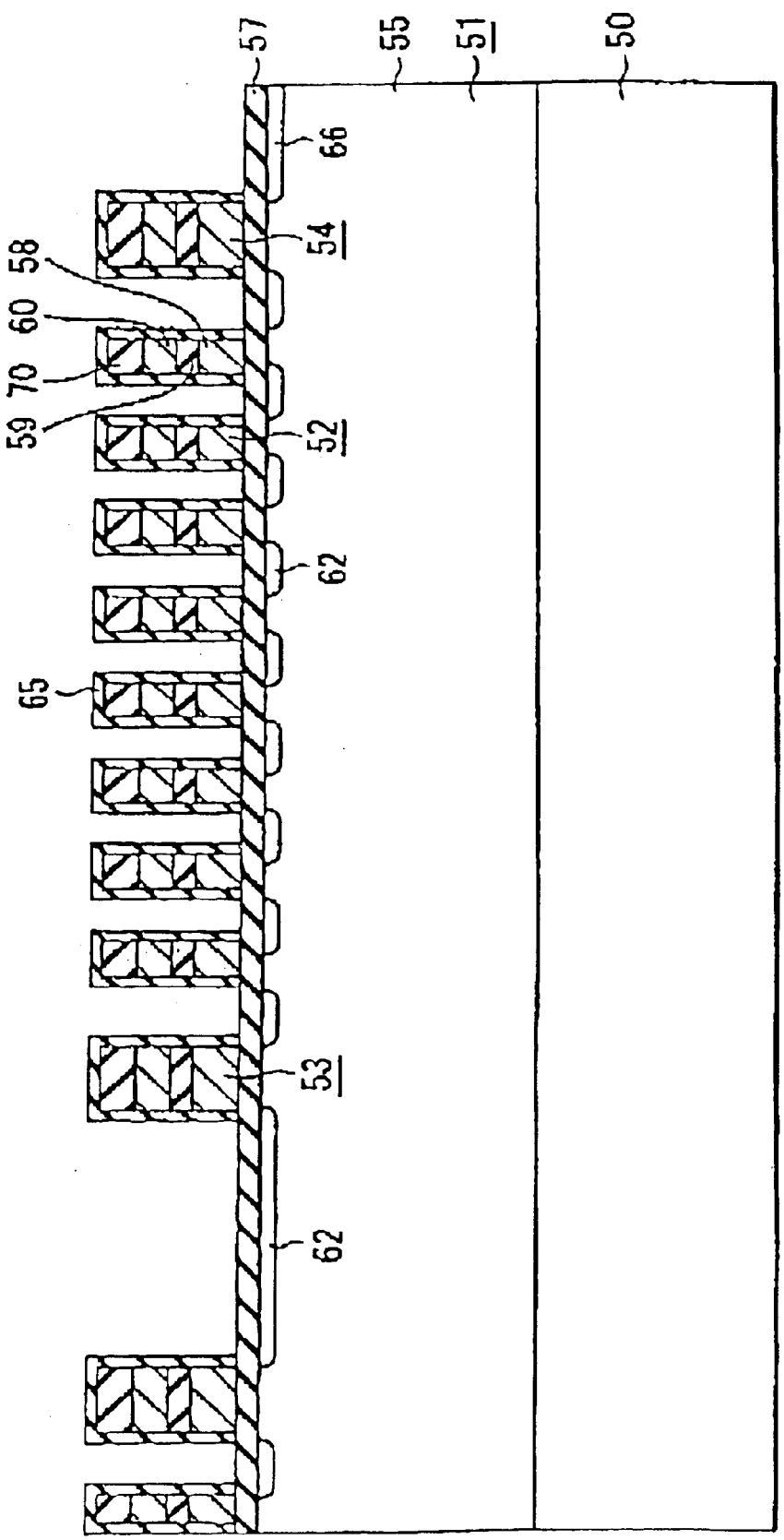
FIG. 34 is a plan view showing one step of a method of manufacturing the conventional semiconductor device shown in FIGS. 31, 32 and 33.
Figure 35:
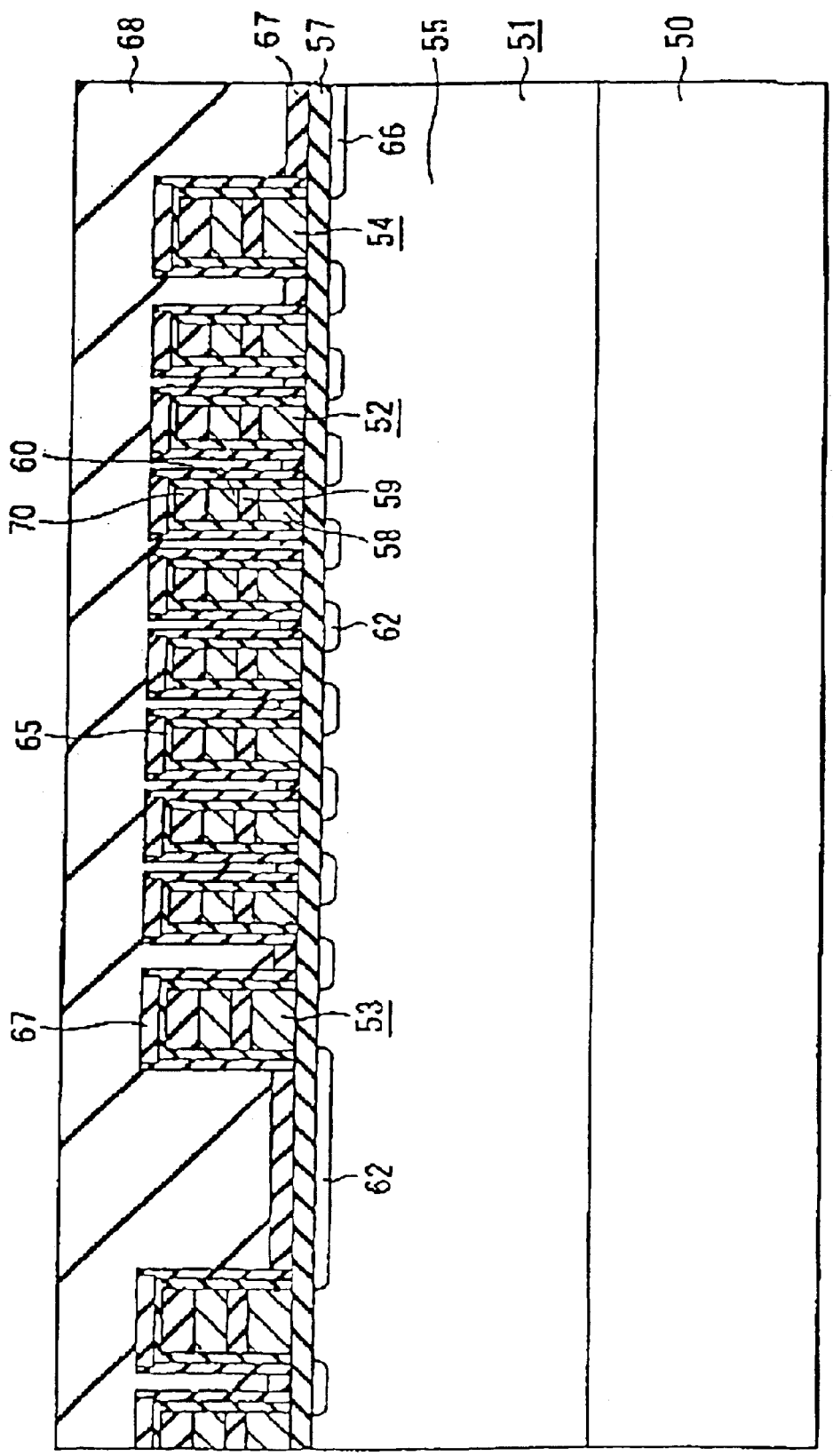
FIG. 35 is a cross sectional view showing one step of the method of manufacturing the conventional semiconductor device shown in FIGS. 31, 32 and 33.
Figure 36:
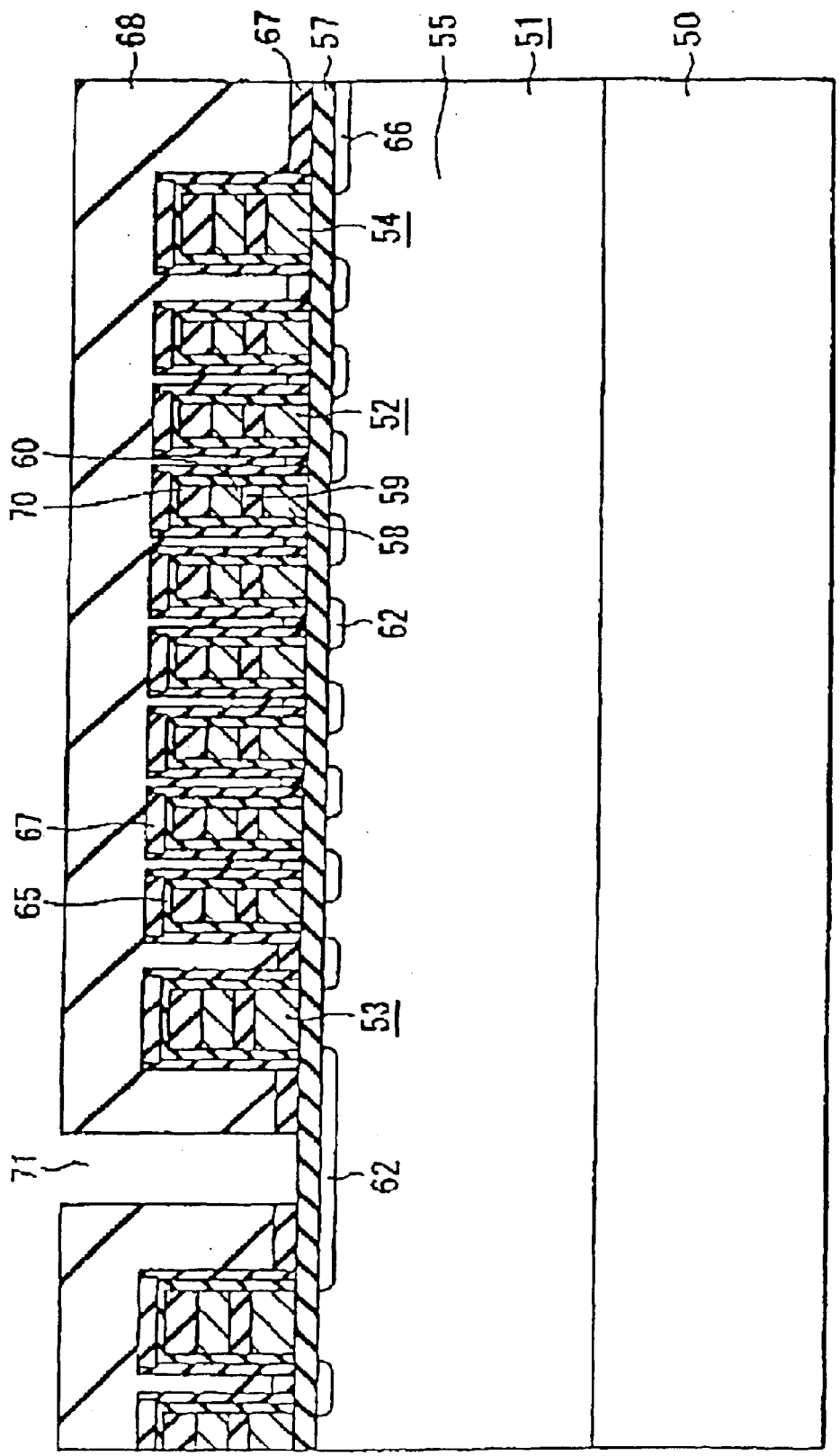
FIG. 36 is a cross sectional view showing one step of the method of manufacturing the conventional semiconductor device shown in FIGS. 31, 32 and 33.
Figure 37:
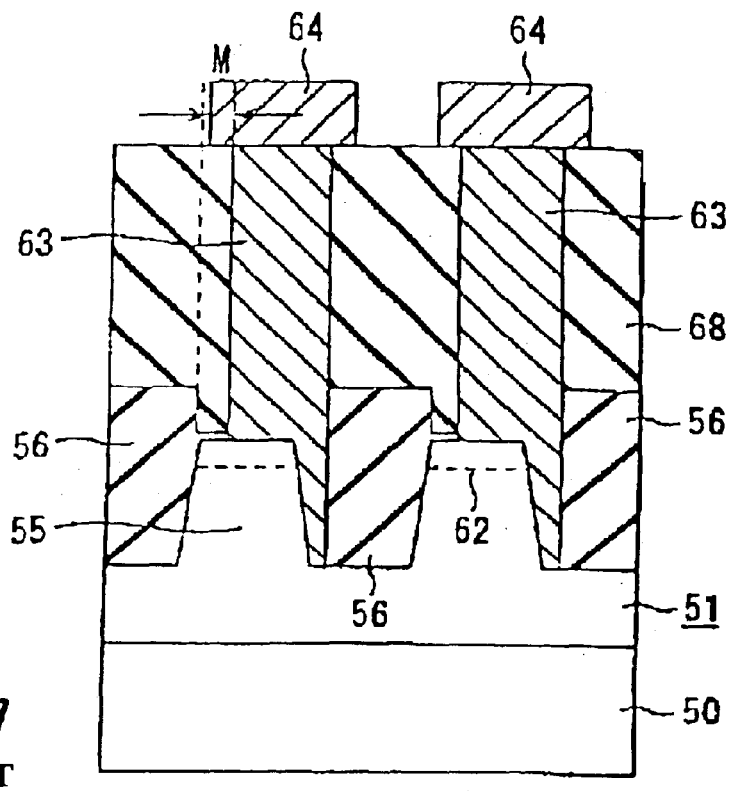
FIG. 37 is a cross sectional view showing a problematic point of etching a contact hole in the method of manufacturing the conventional semiconductor device shown in FIGS. 31, 32 and 33.
Figure 38:
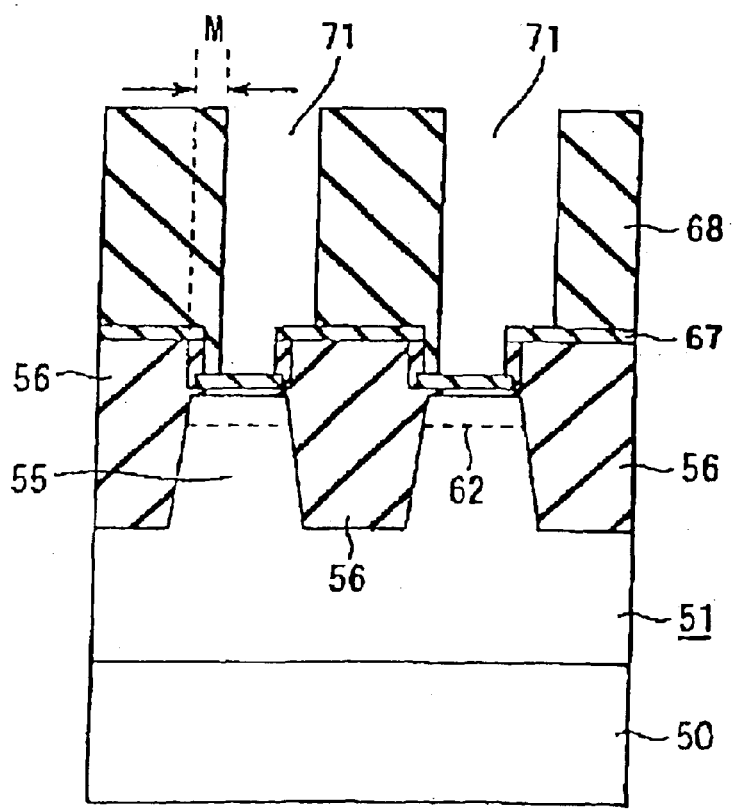
FIG. 38 is a cross sectional view at the time of etching a contact hole in the method of manufacturing the conventional semiconductor device shown in FIGS. 31, 32 and 33.

As shown in FIG. 30, in a conventional semiconductor device, not only a silicon oxide film 65 but also a silicon nitride film 67 are provided between the gates, and thus, the parasitic capacitance between the gates is larger than that in the semiconductor device of the embodiments in which the first insulating layer 25 embedded between the gates is made of silicon oxide alone, even when the distances between the gates is the same.

In each embodiment, a cavity may exist in the first insulating film 25 embedding between the memory cell gate electrodes 13, between the memory cell gate electrode 13 and the drain side selecting gate electrode 2, between the memory cell gate electrode 13 and the source side selecting gate electrode 3, between the drain side selecting gate electrode 2, and the source side selecting gate electrode 3. Even if the cavity exists, as long as the upper surface of the first insulating film 25 is closed, the second insulating film 26 is not embedded in the portion between the gate electrodes of the memory cell transistor, therefore, the effects of the present invention will not be changed.

Moreover, the post-oxidization film 24 may be made by thermal oxidization as shown in the first embodiment, or alternatively, it may be made by depositing an oxide film or the like. Further, it is acceptable even without the post-oxidization film as shown in the third embodiment.

Each embodiment can be carried out in an appropriate combination except for ones described above.

Although each embodiment has been described by exemplifying a memory cell array in a NAND type EEPRM method, it can be also similarly applied to a semiconductor device having a AND type memory cell array, DiNOR type memory cell array or a transistor requiring a high integration.

Specifically, a structure in which a plurality of gates are connected in series and no contact exists between the gates can be applied.

Particularly, it is preferable for a non-volatile semiconductor device which has a contact having no margin with respect to an element region and a strong electric stress as the tunnel current is flown is applied to the gate oxide film.

According to the embodiments, since the deterioration of the electric characteristics such as the variation of threshold voltage of a transistor and the lowering of the breakdown voltage in the gate insulating film can be prevented while the process margin of the etching for opening the contact hole is enhanced, a semiconductor device with a high reliability and a high yield and a method of manufacturing the semiconductor device can be formed.

What is claimed is:

1. A method of manufacturing a semiconductor device comprising:
forming a first gate electrode and a second gate electrode on a semiconductor substrate;
forming a diffusion layer, with the first gate electrode as a mask
forming a first insulating film not containing nitrogen as a major component on said semiconductor substrate to cover said first gate electrode, and said second gate electrode in such a manner that a portion of said first insulating film is embedded between said first gate electrode and said second gate electrode to a height above a height of said first gate electrode;
forming a second insulating film on said first insulating film;
forming on said second insulating film an interlayer insulating film whose etching rate is larger than an etching rate of said second insulating film;
etching a portion of said first insulating film, a portion of said second insulating film and a portion of said interlayer insulating film, which are on said major part of said diffusion layer, to form a contact hole leading to said major part of said diffusion layer; and
embedding a conductive material in said contact hole to form a contact electrode connected to said major part of said diffusion layer.

2. The method of manufacturing a semiconductor device according to claim 1, wherein said first insulating film is formed to cover said diffusion layer.

3. The method of manufacturing a semiconductor device according to claim 1, wherein a density of hydrogen contained in said first insulating film is smaller than a density of hydrogen contained in said second insulating film.

4. The method of manufacturing a semiconductor device according to claim 1, wherein a density of trap with respect to electric charge existing in said first insulating film is smaller than a density of trap with respect to electric charge existing in said second insulating film.

5. The method of manufacturing a semiconductor device according to claim 1, wherein said first insulating film is made of a material selected from a group including silicon oxide, oxy-nitride and oxidized silicon nitride.

6. The method of manufacturing a semiconductor device according to claim 1, wherein said second insulating film is made of silicon nitride.

7. The method of manufacturing a semiconductor device according to claim 1, wherein said first insulating film contains a void.

8. The method of manufacturing a semiconductor device according to claim 1, wherein said interlayer insulating film contains a void.

9. The method of manufacturing a semiconductor device according to claim 1, wherein said portion of said first insulating film is embedded between said first gate electrode and said second gate electrode to a height equal to a height of said first gate electrode and said second gate electrode.

10. The method of manufacturing a semiconductor device according to claim 1, wherein said portion of said first insulating film is embedded between said first gate electrode and said second gate electrode to a height in a middle of a height of said first gate electrode and said second gate electrode.

11. The method of manufacturing a semiconductor device according to claim 1, wherein said portion of said first insulating film is provided on side surfaces of said first gate electrode and said second gate electrode.

12. The method of manufacturing a semiconductor device according to claim 1, wherein a further portion of said first insulating film is formed on upper surfaces of said first gate electrode and said second gate electrode.

13. The method of manufacturing a semiconductor device according to claim 1, wherein said contact electrode is formed in a self-align manner to said first gate electrode.

14. A method of manufacturing a semiconductor device comprising:
forming, on a semiconductor substrate, a plurality of first memory cell gates, a pair of first selecting gates sandwiching said first memory cell gates, a plurality of second memory cell gates and a pair of second selecting gates sandwiching said second memory cell gates;
forming a plurality of diffusion layers in said semiconductor substrate while using as masks said first memory cell gates, said pair of first selecting gates, said second memory cell gates and said pair of second selecting gates;
forming a first insulating film not containing nitrogen as a major component on said semiconductor substrate to cover said first memory cell gates, said second memory cell gates and said diffusion layers in such a manner that portions of said first insulating film are embedded between said first memory cell gates or between said second memory cell gates, a portion of said first insulating film is provided on one of said diffusion layers, on which one of said pair of first selecting gates is adjacent to one of said pair of second selecting gates in such a manner that a part of said portion of said first insulating film, which is on a major part of said one of said diffusion layers, has a thickness thinner than a thickness of said portions of said first insulating film, which are embedded between said first memory cell gates and between said second memory cell gates;
forming a second insulating film on said first insulating film;
forming on said second insulating film an interlayer insulating film whose etching rate is larger than an etching rate of said second insulating film;
etching a portion of said first insulating film, a portion of said second insulating film and a portion of said interlayer insulating film, which are on said major part of said one of said diffusion layers, to form a contact hole leading to said major part of said one of said diffusion layers; and
embedding a conductive material in said contact hole to form a contact electrode connected to said major part of said one of said diffusion layers.

15. The method of manufacturing a semiconductor device according to claim 14, wherein a width of said one of said diffusion layers is larger than a width of each of those of said diffusion layers which are between said first memory cell gates or between said second memory cell gates.

16. The method of manufacturing a semiconductor device according to claim 14, wherein a density of hydrogen contained in said first insulating film is smaller than a density of hydrogen contained in said second insulating film.

17. The method of manufacturing a semiconductor device according to claim 14, wherein a density of trap with respect to electric charge existing in said first insulating film is smaller than a density of trap with respect to electric charge existing in said second insulating film.

18. The method of manufacturing a semiconductor device according to claim 14, wherein said first insulating film is made of a material selected from a group including silicon oxide, oxy-nitride and oxidized silicon nitride.

19. The method of manufacturing a semiconductor device according to claim 14, wherein said second insulating film is made of silicon nitride.

20. The method of manufacturing a semiconductor device according to claim 14, wherein said first insulating film contains a void.

21. The method of manufacturing a semiconductor device according to claim 14, wherein said interlayer insulating film contains a void.

22. The method of manufacturing a semiconductor device according to claim 14, wherein said portions of said first insulating film are embedded between said first memory cell gates or between said second memory cell gates to a height equal to a height of said first memory cell gates and said second memory cell gates.

23. The method of manufacturing a semiconductor device according to claim 14, wherein said portions of said first insulating film are embedded between said first memory cell gates or between said second memory cell gates to a height in a middle of a height of said first memory cell gates and said second memory cell gates.

24. The method of manufacturing a semiconductor device according to claim 14, wherein said portion of said first insulating film is provided on side surfaces of said one of said pair of first selecting gates and said one of said pair of second selecting gates.

25. The method of manufacturing a semiconductor device according to claim 14, wherein a further portion of said first insulating film is formed on upper surfaces of said first memory cell gates and said second memory cell gates.

26. The method of manufacturing a semiconductor device according to claim 14, wherein said contact electrode is formed in a self-align manner to said one of said pair of first selecting gates and said one of said pair of second selecting gates.

27. A method of manufacturing a semiconductor device comprising:

forming a first gate electrode and a second gate electrode on a semiconductor substrate;

forming a first diffusion layer and a second diffusion layer under one and the other of opposite side portions of the first gate electrode, with the first gate electrode as a mask;

forming a first insulating film not containing nitrogen as a major component on said semiconductor substrate to cover said first gate electrode and said second gate electrode in such a manner that a portion of said first insulating film is embedded between said first gate electrode and said second gate electrode to a height above a height of said first gate electrode, another portion of said first insulating film is provided on a major part of said first or second diffusion layer to a height lower than a height of said first gate electrode;

forming a second insulating film on said first insulating film;

forming on said second insulating film an interlayer insulating film whose etching rate is larger than an etching rate of said second insulating film;

etching a portion of said first insulating film, a portion of said second insulating film and a portion of said interlayer insulating film, which are on said major part of said first or second diffusion layer, to form a contact hole leading to said major part of said first or second diffusion layer; and embedding a conductive material in said contact hole to form a contact electrode connected to said major part of said first or second diffusion layer.

28. The method of manufacturing a semiconductor device 27, wherein a width of said first diffusion layer is larger than a width of said second diffusion layer.

* * * * *